US011025141B2

(12) United States Patent
Kagawa et al.

(10) Patent No.: US 11,025,141 B2
(45) Date of Patent: *Jun. 1, 2021

(54) ON-BOARD ELECTRIC COMPRESSOR WITH A MOTOR AND NOISE REDUCING UNIT WITH INVERTER DEVICE HAVING A DAMPING UNIT REDUCING Q VALUE OF LOW PASS FILTER CIRCUIT

(71) Applicant: KABUSHIKI KAISHA TOYOTA JIDOSHOKKI, Kariya (JP)

(72) Inventors: Fumihiro Kagawa, Kariya (JP); Atsushi Naito, Kariya (JP); Yoshiki Nagata, Kariya (JP); Shunsuke Ambo, Kariya (JP); Keiji Yashiro, Kariya (JP); Kazuhiro Shiraishi, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 300 days.

This patent is subject to a terminal disclaimer.

(21) Appl. No.: 16/088,362

(22) PCT Filed: Mar. 30, 2017

(86) PCT No.: PCT/JP2017/013143
§ 371 (c)(1),
(2) Date: Sep. 25, 2018

(87) PCT Pub. No.: WO2017/170817
PCT Pub. Date: Oct. 5, 2017

(65) Prior Publication Data
US 2020/0321836 A1    Oct. 8, 2020

(30) Foreign Application Priority Data
Mar. 31, 2016 (JP) .............................. JP2016-072936

(51) Int. Cl.
*H03H 7/00* (2006.01)
*H02K 11/33* (2016.01)
(Continued)

(52) U.S. Cl.
CPC ............ *H02K 11/33* (2016.01); *F25B 31/026* (2013.01); *H02K 11/022* (2013.01); *H03H 7/0115* (2013.01); *H02K 2211/03* (2013.01)

(58) Field of Classification Search
CPC ................. H02K 11/02; H02K 11/022; H02K 11/042–048; H02K 11/049; H02K 11/05;
(Continued)

(56) References Cited

U.S. PATENT DOCUMENTS 6,151,228 A * 11/2000 Miyazaki .................. H02J 3/01
363/48
8,777,585 B2   7/2014 Nakano et al.
(Continued)

FOREIGN PATENT DOCUMENTS

CN    104421134 A    3/2015
JP    03-286511 A    12/1991
(Continued)

OTHER PUBLICATIONS

International Preliminary Report on Patentability with translation of Written Opinion dated Oct. 2, 2018, issued by the International Searching Authority in application No. PCT/JP2017/013143.
(Continued)

*Primary Examiner* — Maged M Almawri
(74) *Attorney, Agent, or Firm* — Sughrue Mion, PLLC

(57) ABSTRACT

An on-board electric compressor that comprises: a housing; a compression unit; an electric motor; and an inverter device. The inverter device comprises: an inverter circuit that converts direct current power to alternating current power; and a noise reduction unit that is provided on an
(Continued)

input side of the inverter circuit and that reduces common mode noise and normal mode noise that are included in the direct current power The noise reduction unit comprises: a common mode choke coil; and a smoothing capacitor that, in cooperation with the common mode choke coil, constitutes a low pass filter circuit. The common mode choke coil has: a core that has a first core part and a second core part; a first winding that is wound around the first core part; and a second winding that is wound around the second core part.

11 Claims, 10 Drawing Sheets

(51) Int. Cl.
F25B 31/02 (2006.01)
H02K 11/22 (2016.01)
H03H 7/01 (2006.01)

(58) Field of Classification Search
CPC ...... H02K 11/33; H02K 11/225; H02K 11/30; H02K 2211/03; H03H 7/0115; F25B 31/026; F25B 417/41; H02M 1/44; H02M 1/143; H02M 7/003
USPC .................................................. 310/68 R, 71
See application file for complete search history.

(56) References Cited

U.S. PATENT DOCUMENTS

| | | | | |
|---|---|---|---|---|
| 8,796,889 B2 * | 8/2014 | Arashi | ................ | B60H 1/3229 307/326 |
| 10,277,116 B2 * | 4/2019 | Naito | ...................... | H02M 7/48 |
| 2010/0045418 A1 * | 2/2010 | Nishikawa | ............ | H01F 17/045 336/192 |
| 2011/0206544 A1 * | 8/2011 | Saito | ..................... | F04B 39/121 417/410.1 |
| 2013/0010434 A1 * | 1/2013 | Kojima | ................... | H01F 27/36 361/748 |
| 2015/0048675 A1 * | 2/2015 | Fujii | ......................... | B60L 1/02 307/10.1 |
| 2015/0056086 A1 * | 2/2015 | Yano | ...................... | H02K 11/33 417/410.5 |
| 2017/0274735 A1 * | 9/2017 | Kawasaki | ............... | H02M 1/14 |
| 2017/0288512 A1 * | 10/2017 | Kagawa | ............... | B60H 1/3222 |
| 2018/0123546 A1 * | 5/2018 | Kagawa | .................. | H02P 27/06 |
| 2018/0194200 A1 | 7/2018 | Ambo et al. | | |
| 2018/0198350 A1 * | 7/2018 | Ambo | ................... | H01F 27/346 |

FOREIGN PATENT DOCUMENTS

| | | | |
|---|---|---|---|
| JP | 06-069680 | A | 3/1994 |
| JP | 07-066041 | A | 3/1995 |
| JP | 2000-166254 | A | 6/2000 |
| JP | 2006-180578 | A | 7/2006 |
| JP | 4835751 | B2 | 12/2011 |
| JP | 2012-120348 | A | 6/2012 |
| JP | 5039515 | B2 | 10/2012 |
| JP | 2015-033143 | A | 2/2015 |
| JP | 2015-112965 | A | 6/2015 |
| JP | 2015-220885 | A | 12/2015 |
| KR | 19990037206 | A | 5/1999 |
| WO | 2014033852 | A1 | 3/2014 |

OTHER PUBLICATIONS

International Search Report of PCT/JP2017/013143 filed May 23, 2017.

* cited by examiner

ON-BOARD ELECTRIC COMPRESSOR WITH A MOTOR AND NOISE REDUCING UNIT WITH INVERTER DEVICE HAVING A DAMPING UNIT REDUCING Q VALUE OF LOW PASS FILTER CIRCUIT

This application is a National Stage of International Application No. PCT/JP2017/013143 filed Mar. 30, 2017, claiming priority based on Japanese Patent Application No. 2016-072936 filed Mar. 31, 2016.

TECHNICAL FIELD

The present invention relates to an on-board motor-driven compressor (a motor-driven compressor configured to be installed in a vehicle).

BACKGROUND ART

An on-board motor-driven compressor including a compression unit, an electric motor that drives the compression unit, and an inverter device that drives the electric motor is known in the art (for example, refer to patent document 1).

PRIOR ART DOCUMENT

Patent Document

Patent document 1: Japanese Patent No. 5039515

SUMMARY OF THE INVENTION

Problems that are to be Solved by the Invention

The inverter device converts direct current (DC) power to alternating current (AC) power. However, common mode noise and normal mode noise may both be mixed in the DC power before being input to the inverter device. In such a case, the inverter device may not be able to perform power conversion in a normal manner because of such noise. This may hinder the operation of the on-board motor-driven compressor.

In particular, the frequency of the normal mode noise differs between the type of vehicle on which the on-board motor-driven compressor is mounted. Thus, from the standpoint of versatility allowing for application to many vehicles models, it is desirable that the normal mode noise of a wide frequency band be reduced. In addition, it is preferred that the on-board motor-driven compressor not be enlarged since it is mounted on a vehicle.

It is an object of the present invention to provide an on-board motor-driven compressor that reduces common mode noise and normal mode noise that are included in the DC power.

Means for Solving the Problem

An on-board motor driven compressor that achieves the above object includes an on-board motor-driven compressor provided with a housing including a suction port through which fluid is drawn in, a compression unit accommodated in the housing and configured to compress the fluid, an electric motor accommodated in the housing and configured to drive the compression unit, and an inverter device configured to drive the electric motor. The inverter device includes an inverter circuit configured to convert DC power to AC power and a noise reducing unit arranged at an input side of the inverter circuit and configured to reduce common mode noise and normal mode noise contained in the DC power before the DC power is input to the inverter circuit. The noise reducing unit includes a common mode choke coil including a core having a first core portion and a second core portion, a first winding wound around the first core portion, and a second winding wound around the second core portion. Further, the noise reducing unit includes a smoothing capacitor that cooperates with the common mode choke coil to configure a low pass filter circuit. The inverter device further includes a damping unit located at a position intersecting a magnetic path of a leakage magnetic flux generated from the common mode choke coil. The damping circuit generates eddy current with the leakage magnetic flux to lower a Q value of the low pass filter circuit.

According to such a configuration, the common mode noise contained in the converted DC power is reduced by the common mode choke coil. Furthermore, the common mode choke coil generates the leakage magnetic flux when the normal mode current flows. Thus, the normal mode noise can be reduced using the low pass filter circuit configured by the common mode choke coil and the smoothing capacitor. Thus, a dedicated coil for reducing the normal mode noise can be omitted, enlargement of the inverter device can be avoided, and enlargement of the on-board motor-driven compressor can be avoided.

In particular, a power having a magnitude of a certain extent is generally required to drive an electric motor of the on-board motor-driven compressor. Thus, a relatively large DC power needs to be converted to the AC power for the inverter device to drive the electric motor. The coil for the normal mode noise that can be applied to such large DC power has a tendency to be large. Thus, the noise reducing unit has a tendency to be large.

With the present configuration, the inverter device including the noise reducing unit described above is used as a device for driving the electric motor so that the on-board motor-driven compressor can be operated while limiting enlargement of the on-board motor-driven compressor and reducing the two types of noise.

Furthermore, with the present configuration, since the Q value of the low pass filter circuit is lowered by the damping unit, normal mode noise having a frequency close to the resonance frequency of the low pass filter circuit can be reduced with the noise reducing unit. This widens the frequency band of the normal mode noise that can be reduced by the noise reducing unit and improves the versatility. Furthermore, the damping unit is located at a position intersecting the magnetic path of the leakage magnetic flux. Thus, the flowing current is small and less heat is generated compared to a damping resistor connected in series to the common mode choke coil. Therefore, the inverter device is reduced in size more easily than when using the damping resistor. Therefore, the versatility is improved while limiting enlargement of the on-board motor-driven compressor and reducing the two types of noise, namely, the common mode noise and the normal mode noise.

Preferably, the damping unit covers at least one part of a side surface of the common mode choke coil. With such a configuration, the damping unit covers at least part of the side surface of the common mode choke coil so that the damping unit functions as a magnetic resistor that lower the Q value. This lowers the Q value of the low pass filter with a relatively simple configuration.

Preferably, the inverter device includes a circuit board including a wire pattern and an inverter case accommodating the inverter circuit, the circuit board, and the noise reducing unit. The damping unit is box-shaped and includes an opening covered by the inverter case. The common mode choke coil is accommodated in an accommodation compartment defined by the damping unit and the inverter case. With such a configuration, the damping unit covers surfaces of the common mode choke coil other than the surface at the side of the opening. Further, by covering the opening of the damping unit with the inverter case, the inverter case functions to lower the Q value of the low pass filter circuit. This lowers the Q value of the low pass filter circuit in a preferred manner.

Preferably, the damping unit includes a shield electrically conductive metal film that covers at least one part of the common mode choke coil.

Preferably, the inverter device includes a circuit board including a wire pattern. The damping unit includes a shield electrically conductive metal case including an opening. The common mode choke coil is accommodated in the shield electrically conductive metal case through the opening, and the shield electrically conductive metal case is fixed to the circuit board so as to close the opening with the circuit board. A shield electrically conductive metal film is formed in a region at an inner side of the opening on the circuit board. Further, preferably, the shield electrically conductive metal film is a shield pattern conductor.

Effect of the Invention

The present invention reduces the common mode noise and normal mode noise that are included in the DC power in a preferred manner.

EMBODIMENTS OF THE INVENTION

First Embodiment

One embodiment of an on-board motor-driven compressor will now be described. The on-board motor-driven compressor of the present embodiment is used in an on-board air conditioner. That is, fluid compressed by the on-board motor-driven compressor is a refrigerant.

Figure 1:
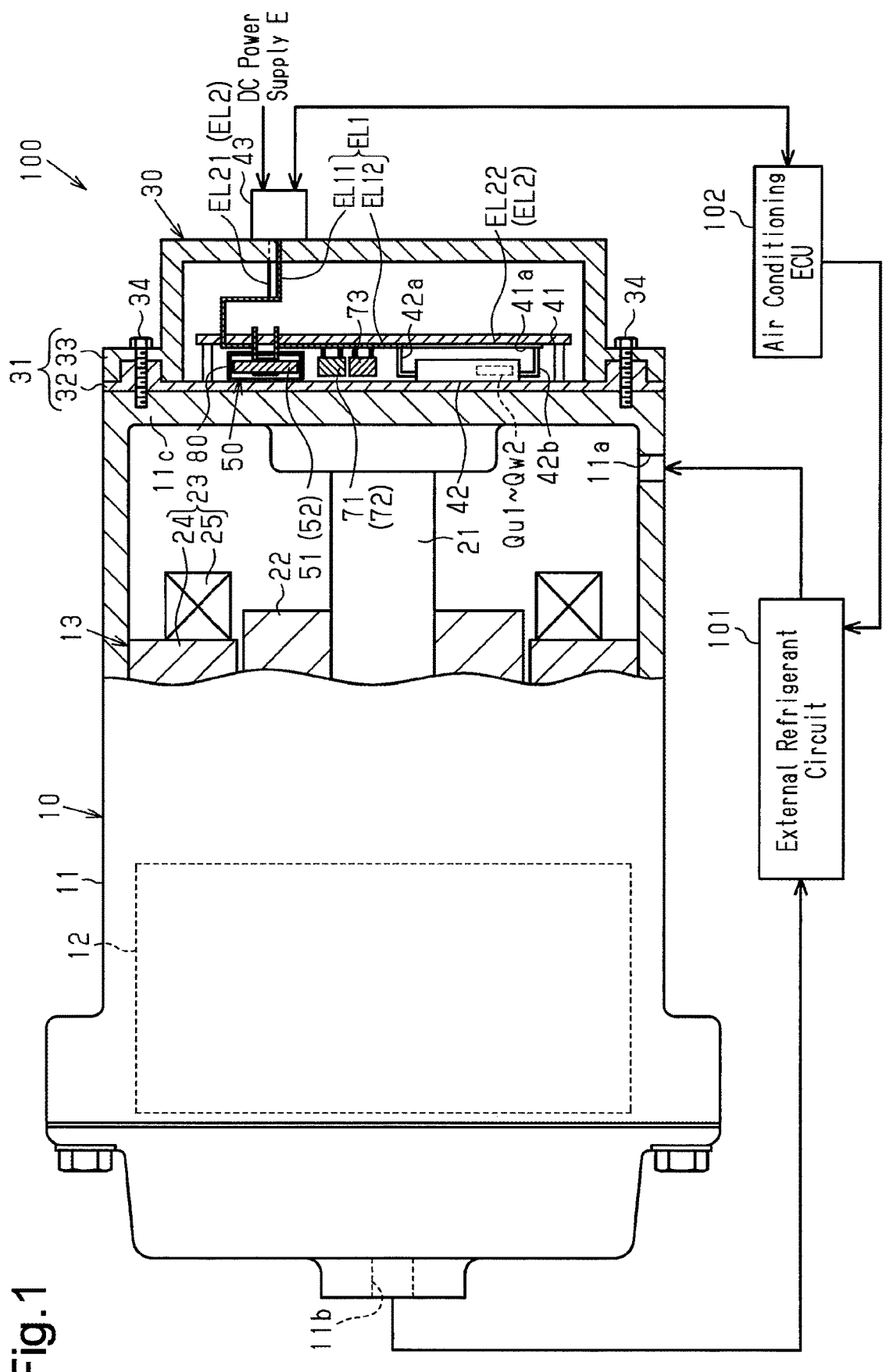
FIG. 1 is a partially cutaway view schematically showing an on-board air conditioner including an on-board motor-driven compressor according to a first embodiment.

As shown in FIG. 1, an on-board air conditioner 100 includes an on-board motor-driven compressor 10 and an external refrigerant circuit 101 that supplies the on-board motor-driven compressor 10 with the refrigerant serving as the fluid. The external refrigerant circuit 101 includes, for example, a heat exchanger, an expansion valve, and the like. The on-board air conditioner 100 cools and warms the passenger compartment by compressing the refrigerant with the on-board motor-driven compressor 10 and carrying out heat exchange and expansion of the refrigerant with the external refrigerant circuit 101.

The on-board air conditioner 100 includes an air conditioning ECU 102 that controls the entire on-board air conditioner 100. The air conditioning ECU 102 is configured to acknowledge that an on-board temperature, a set temperature of the air conditioner 100, and the like. Based on such parameters, the air conditioning ECU 102 transmits various types of commands such as an ON/OFF command to the on-board motor-driven compressor 10.

The on-board motor-driven compressor 10 includes a housing 11, a compression unit 12, and an electric motor 13. The housing 11 includes a suction port 11a through which the refrigerant is drawn in from the external refrigerant circuit 101. The compression unit 12 and the electric motor 13 are accommodated in the housing 11.

The housing 11 in overall has a substantially cylindrical shape and is made of a thermally conductive material (e.g., metal such as aluminum). The housing 11 includes a discharge port 11b from which the refrigerant is discharged. The housing 11 is grounded to a body of the vehicle.

When a rotation shaft 21, which will be described later, is rotated, the compression unit 12 compresses the refrigerant drawn into the housing 11 from the suction port 11a and discharges the compressed refrigerant from the discharge port 11b. The compression unit 12 may have any configuration such as that of a scroll type, a piston type, a vane type, or the like.

The electric motor 13 drives the compression unit 12. The electric motor 13 includes, for example, a rotation shaft 21, a rotor 22, and a stator 23. The rotation shaft 21 is cylindrical and rotationally supported by the housing 11. The rotor 22 is tubular and fixed to the rotation shaft 21. The stator 23 is fixed to the housing 11. An axial direction of the rotation shaft 21 coincide with and an axial direction of the cylindrical housing 11. The stator 23 includes a tubular stator core 24 and coils 25 wound around teeth formed on the stator core 24. The rotor 22 and the stator 23 oppose each other in a radial direction of the rotation shaft 21. When current flows through the coils 25, the rotor 22 and the rotation shaft 21 rotate, and the compression unit 12 compresses the refrigerant. The drive current of the electric motor 13 is high compared to the current of a signal or the like and is, for example, greater than or equal to 10 A, preferably, greater than or equal to 20 A.

As shown in FIG. 1, the on-board motor-driven compressor 10 includes an inverter device 30 that drives the electric motor 13.

The inverter device 30 includes an inverter case 31 accommodating various types of components such as a circuit board 41, a power module 42, a noise reducing unit 50, and the like. The inverter case 31 is configured by a thermally conductive non-magnetic body of an electrically conductive material (e.g., metal such as aluminum).

The inverter case 31 includes a plate-shaped base member 32, which is in contact with the housing 11, and a tubular cover member 33, which is coupled to the base member 32. More specifically, among the walls located at the two axial ends of the housing 11, the base member 32 is in contact with a wall 11c at a side opposite to the discharge port 11b. The cover member 33 includes an opening and an end wall. The base member 32 and the cover member 33 are fixed to the housing 11 by bolts 34 serving as fasteners. This attaches the inverter device 30 to the housing 11. That is, the inverter device 30 of the present embodiment is integrated with the on-board motor-driven compressor 10.

Since the inverter case 31 and the housing 11 are in contact, the inverter case 31 and the housing 11 are thermally coupled. Further, the inverter device 30 is located at a position thermally coupling with the housing 11. The refrigerant does not directly flow into the inverter case 31.

The wall 11c of the housing 11 where the inverter case 31 is attached is arranged at the side of the electric motor 13 opposite to the compression unit 12. Thus, the inverter case 31 is also located at the side of the electric motor 13 opposite to the compression unit 12. The compression unit 12, the electric motor 13, and the inverter device 30 are lined in the axial direction of the rotation shaft 21. That is, the on-board motor-driven compressor 10 of the present embodiment is of the so-called in-line type.

The inverter device 30 includes, for example, the circuit board 41, which is fixed to the base member 32, and the power module 42, which is mounted on the circuit board 41. The circuit board 41 is arranged opposing the base member 32, which is spaced apart by a predetermined distance in the axial direction of the rotation shaft 21, includes a board surface 41a opposing the base member 32. The board surface 41a is the surface on which the power module 42 is mounted.

The power module 42 includes an output is electrically connected to the coils 25 of the electric motor 13 via a hermetic terminal (not shown) arranged in the wall 11c of the housing 11. The power module 42 includes a plurality of switching elements Qu1, Qu2, Qv1, Qv2, Qw1, and Qw2 (hereinafter simply referred to as the switching elements Qu1 to Qw2). In the present embodiment, the power module 42 corresponds to an "inverter circuit."

The inverter case 31 (specifically, cover member 33) includes a connector 43. A DC power supply E mounted on the vehicle supplies DC power to the inverter device 30, and the connector 43 electrically connects the air conditioning ECU 102 and the inverter device 30. A power supply capacitor C0 connected in parallel to the DC power supply E is arranged in the vehicle (see FIG. 5). The power supply capacitor C0 is, for example, configured by a film capacitor.

The inverter device 30 includes two wires EL1 and EL2 that electrically connect the connector 43 and an input portion of the power module 42. The first wire EL1 is connected to a positive terminal (positive electrode terminal) of the DC power supply E and connected to a first module input terminal 42a, which is a first input terminal of the power module 42, via the connector 43. The second wire EL2 is connected to a negative terminal (negative electrode terminal) of the DC power supply E and connected to a second module input terminal 42b, which is a second input terminal of the power module 42, via the connector 43. The inverter device 30 converts DC power to AC power and outputs the AC power to the coils 25 of the electric motor 13 when the switching elements Qu1 to Qw2 are cyclically turned ON and OFF under a situation in which the DC power is being input to the power module 42 through the two wires EL1 and EL2. This drives the electric motor 13.

The current (i.e., power) handled by the inverter device 30 is large enough to drive the electric motor 13 and greater than the current (i.e., power) of a signal or the like. For example, the current handled by the inverter device 30 is greater than or equal to 10 A and preferably greater than or equal to 20 A. Furthermore, the DC power supply E is an on-board power storage device such as, for example, a rechargeable battery, a capacitor, or the like.

Figure 2:
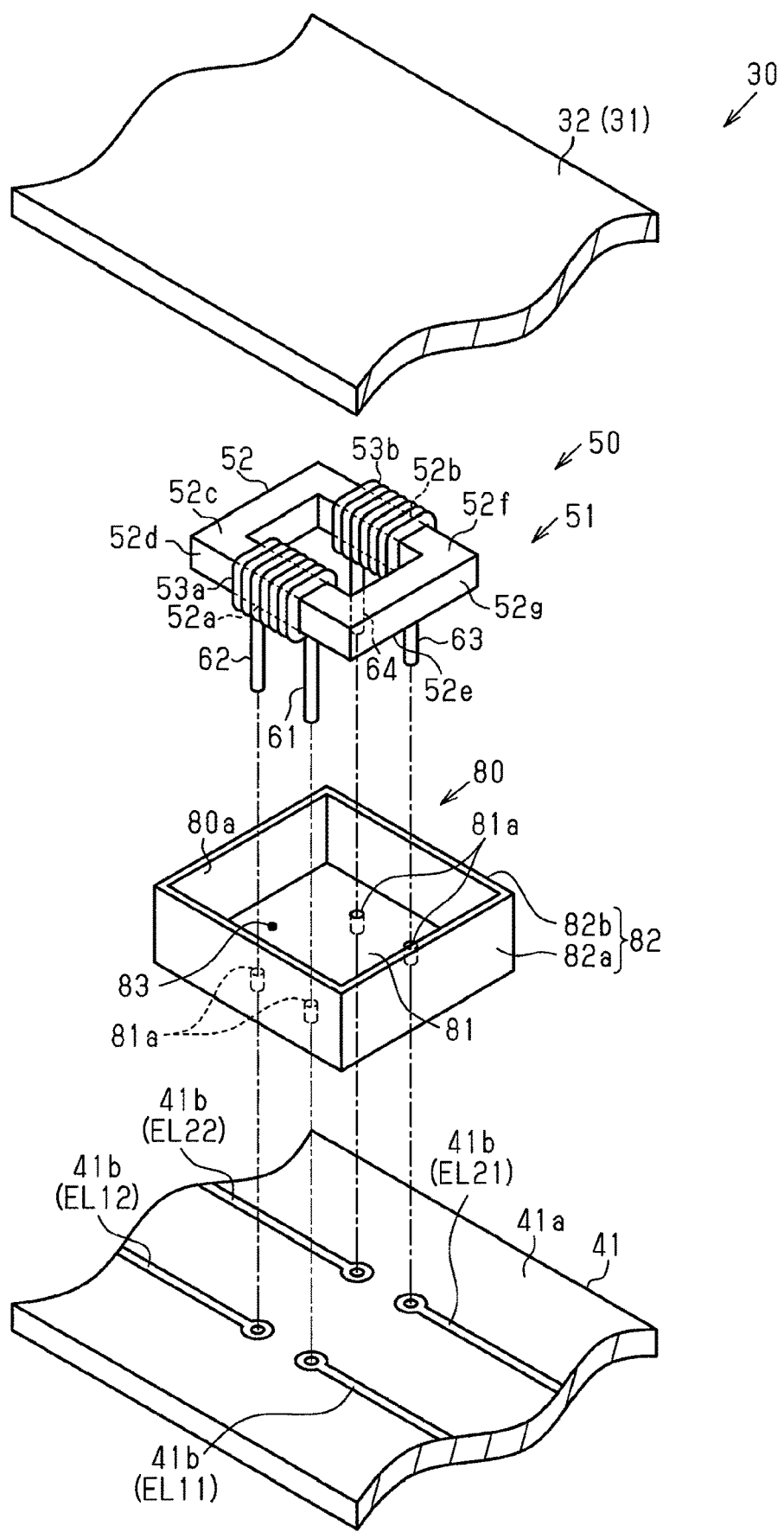
FIG. 2 is an exploded perspective view schematically showing a noise reducing unit in the on-board motor-driven compressor of FIG. 1.

As shown in FIG. 2, a plurality of wire patterns 41b configuring parts of the wires EL1 and EL2 are formed on the circuit board 41. Each wire pattern 41b is formed by a plurality of layers and includes, for example, the board surface 41a and a surface opposite to the board surface 41a. The wire pattern 41b may have any structure and, for example, may have the form of a rod like a bus bar or have the form of a flat plate.

The DC power transmitted from the connector 43 toward the power module 42, specifically, the DC power transmitted through the wires EL1 and EL2 may contain common mode noise and normal mode noise.

The common mode noise is noise in which the current in the same direction flows through the wires EL1 and EL2. The common mode noise is generated when, for example, the inverter device 30 (i.e., on-board motor-driven compressor 10) and the DC power supply E are electrically connected through a path (e.g., body of the vehicle, etc.) other than the wires EL1 and EL2. The normal mode noise is noise having a predetermined frequency superimposed on the DC power. Further, the normal mode noise is noise in which current momentarily flows through the wires EL1 and EL2 in opposite directions. The normal mode noise is a flow-in ripple component contained in the DC power flowing into the inverter device 30. The normal mode noise will be described later in detail.

In this regard, the inverter device 30 of the present embodiment includes a noise reducing unit 50 that reduces (attenuates) the common mode noise and the normal mode noise contained in the DC power transmitted from the connector 43 toward the power module 42. The noise reducing unit 50 is arranged on both wires EL1 and EL2, and the DC power supplied from the connector 43 passes through the noise reducing unit 50 before entering the power module 42.

The noise reducing unit 50 will now be described in detail.

Figure 3:
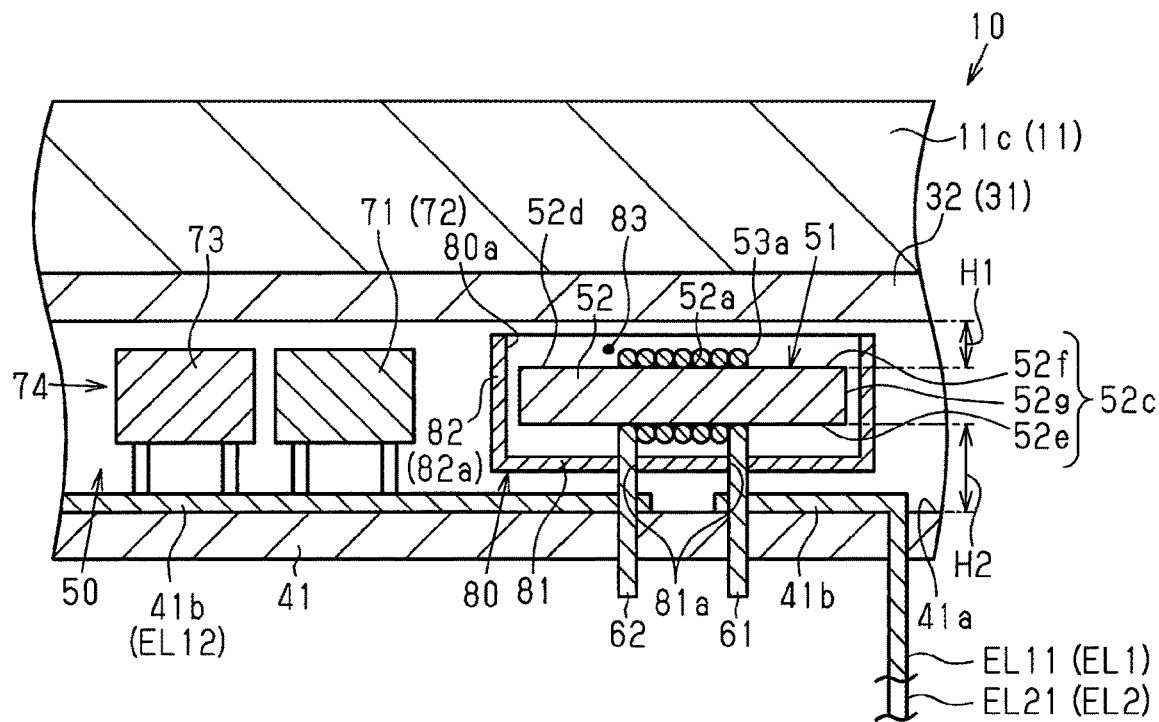
FIG. 3 is a cross-sectional view schematically showing the noise reducing unit of FIG. 2.
Figure 4:
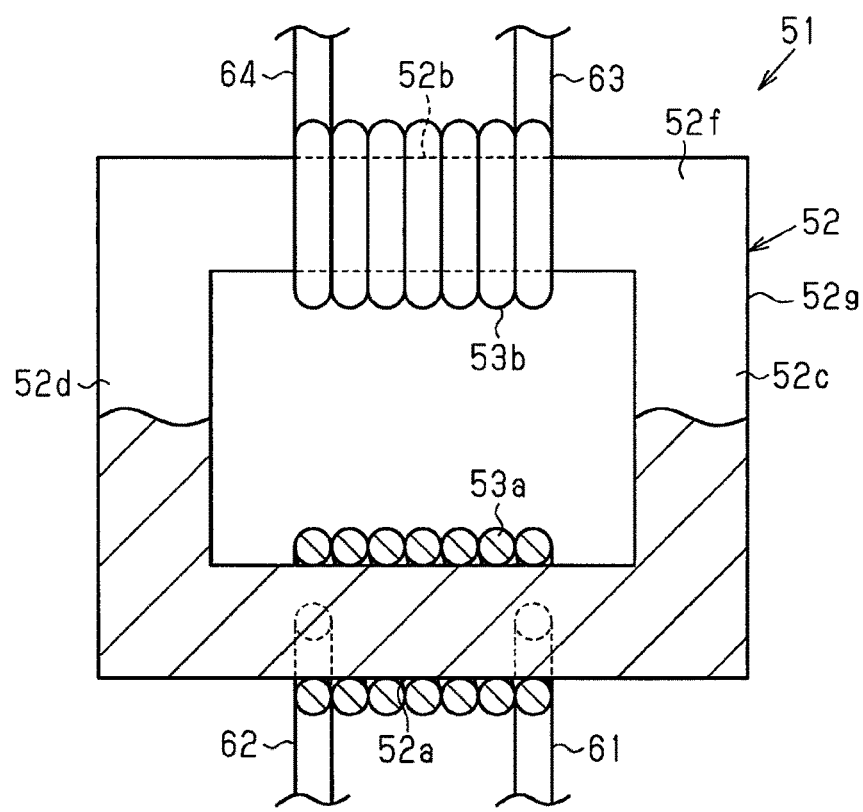
FIG. 4 is a partially cutaway view of a common mode choke coil in the noise reducing unit of FIG. 2.

As shown in FIGS. 2 to 4, the noise reducing unit 50 includes, for example, a common mode choke coil 51. The common mode choke coil 51 includes a core 52, a first winding 53a, and a second winding 53b. The first winding 53a and the second winding 53b are wound around the core 52.

The core 52 has, for example, a predetermined thickness and the form of a polygonal (rectangular in the present embodiment) ring (endless form). In other words, the core 52 can also be said as having a tubular shape of a predetermined thickness. As shown in FIGS. 2 and 4, the core 52 includes a first core portion 52a around which the first winding 53a is wound, a second core portion 52b around which the second winding 53b is wound, and an exposed portion 52d where the windings 53a and 53b are not wound and a surface 52c of the core 52 is exposed. The windings 53a and 53b are opposed to each other and have winding axes extending in the same direction. In the present embodiment, the number of winding (number of turns) is set to be the same in the two windings 53a and 53b.

In the present embodiment, the core 52 is configured by a single part. Instead, the core 52 may, for example, be configured by coupling two symmetrical shaped parts or may be configured by three or more parts.

As shown in FIG. 2, the common mode choke coil 51 includes a first input terminal 61 and a first output terminal 62, which extend from the first winding 53a, and a second input terminal 63 and a second output terminal 64, which extend from the second winding 53b.

Figure 5:
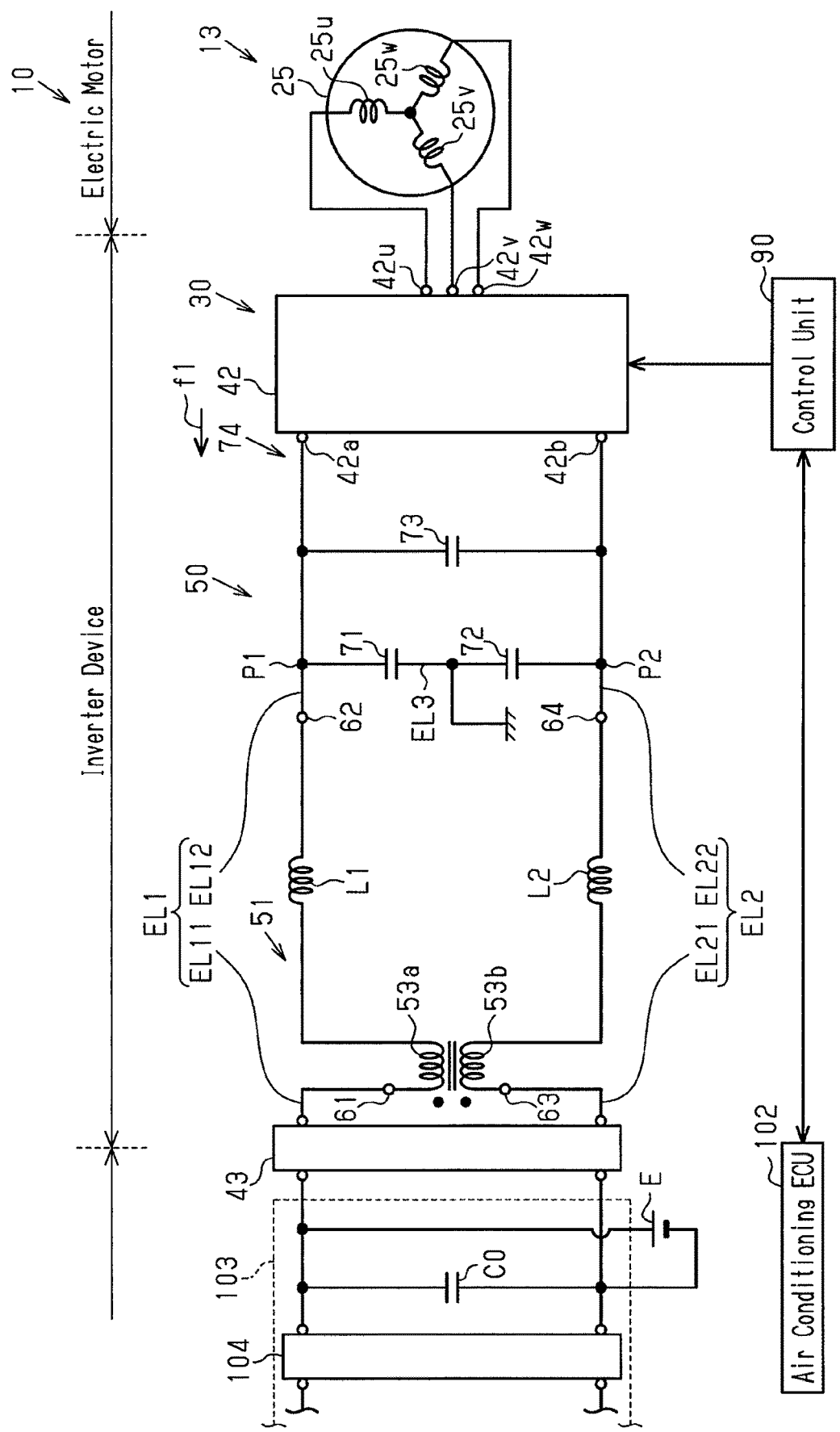
FIG. 5 is an equivalent circuit diagram showing the electrical configuration of the on-board motor-driven compressor of FIG. 1

As shown in FIGS. 3 and 5, the first wire EL1 used to connect the positive terminal of the DC power supply E and the power module 42 includes a first connector wire EL11, which connects the connector 43 and the first input terminal 61, and a first module wire EL12, which connects the first output terminal 62 and the first module input terminal 42a.

The second wire EL2 used to connect the negative terminal of the DC power supply E and the power module 42 includes a second connector wire EL21, which connects the connector 43 and the second input terminal 63, and a second module wire EL22, which connects the second output terminal 64 and the second module input terminal 42b. Thus, the DC power of the DC power supply E is input to the power module 42 through the connector wires EL11 and EL21, the two windings 53a and 53b, and the two module wires EL12 and EL22. That is, the two module wires EL12 and EL22 connect the output of the common mode choke coil 51 and the input of the power module 42. In this case, the two windings 53a and 53b are included in the wires EL1 and EL2. The terminals 61 and 62 are the two ends of the first winding 53a, and the terminals 63 and 64 are the two ends of the second winding 53b. Furthermore, the wire pattern 41b formed on the circuit board 41 includes the two connector wires EL11 and EL21 and the two module wires EL12 and EL22.

The common mode choke coil 51 is configured so that the impedance (specifically, inductance) becomes relatively large when a common mode current flows through the two wires EL1 and EL2 and so that the impedance becomes relatively small when a normal mode current flows through the two wires EL1 and EL2. Specifically, the windings 53a and 53b are wound to generate magnetic fluxes that strengthen each other when the common mode current flows in the same direction through the two wires EL1 and EL2 (i.e., two windings 53a and 53b), and the windings 53a and 53b are wound to generate magnetic fluxes that cancel each other when the normal mode current flows in opposite directions through the two wires EL1 and EL2.

Since the core 52 includes the exposed portion 52d, a leakage magnetic flux is generated in the common mode choke coil 51 in a situation where the normal mode current is flowing through the two wires EL1 and EL2. That is, the common mode choke coil 51 has a predetermined inductance with respect to the normal mode current. The leakage magnetic flux is generated at the periphery of the common mode choke coil 51 and has a tendency to concentrate at the two ends in the winding axis direction of the windings 53a and 53b.

As shown in FIGS. 3 and 5, the noise reducing unit 50 includes bypass capacitors 71 and 72, which reduce the common mode noise, and a smoothing capacitor 73, which is arranged separate from the bypass capacitors 71 and 72. The smoothing capacitor 73 is configured by, for example, a film capacitor or an electrolytic capacitor. The smoothing capacitor 73 cooperates with the common mode choke coil 51 to configure a low pass filter circuit 74. The low pass filter circuit 74 reduces the normal mode noise flowing from the DC power supply E. The low pass filter circuit 74 is a resonance circuit and also referred to as an LC filter.

As shown in FIG. 3, the common mode choke coil 51 and each of the capacitors 71 to 73 are arranged between the board surface 41a of the circuit board 41 and the base member 32. The common mode choke coil 51 is arranged in a state in which the winding axis direction of the windings 53a and 53b intersect (specifically, is orthogonal to) the opposing direction of the board surface 41a and the base member 32. In this case, the thickness-wise direction of the core 52 coincides with the opposing direction.

A surface of the core 52 opposing the board surface 41a is referred to as a bottom core surface 52e, and a surface opposing the base member 32 is referred to as an upper core surface 52f. A surface of the core 52 continuous with both of the upper core surface 52f and the bottom core surface 52e and configuring the outer contour of the core 52 is referred to as a peripheral core surface 52g. The peripheral core surface 52g (side surface of the common mode choke coil 51) is a surface intersecting a plane including the winding axis of the windings 53a and 53b (plane orthogonal to the thickness-wise direction of the core 52 in the present embodiment). The peripheral core surface 52g extends along the magnetic flux flowing in the core 52 and intersects the leakage magnetic flux.

In the present embodiment, the peripheral core surface 52g is parallel to the thickness-wise direction of the core 52. The peripheral core surface 52g includes a portion intersecting (specifically, orthogonal) to the winding axis direction of the windings 53a and 53b and a portion parallel to the winding axis direction of the windings 53a and 53b.

Furthermore, the side surface of the common mode choke coil 51 is configured by the peripheral core surface 52g (specifically, portion configuring the exposed portion 52d of the peripheral core surface 52g) and a portion on the peripheral core surface 52g where the windings 53a and 53b are arranged.

As shown in FIGS. 2 and 3, the inverter device 30 includes a damping unit 80 that lowers the Q value of the low pass filter circuit 74. The damping unit 80, which is located at a position intersecting the magnetic path of the leakage magnetic flux generated from the common mode choke coil 51, generates eddy current with the leakage magnetic flux generated from the common mode choke coil 51.

The damping unit 80 is configured by, for example, a non-magnetic body of an electrically conductive material of aluminum or the like. The specific permeability of the damping unit 80 is preferably set to, for example, "0.9 to 3."

The damping unit 80, which is arranged between the board surface 41a of the circuit board 41 and the base member 32, is box-shaped and includes an opening 80a open toward the base member 32 and a bottom portion (end wall). The damping unit 80 covers the entire bottom core surface 52e and the peripheral core surface 52g. Specifically, the damping unit 80 includes a bottom damping portion 81 that covers the bottom core surface 52e, which is the bottom surface of the common mode choke coil 51, and a side damping portion that covers the peripheral core surface 52g, which is the side surface of the common mode choke coil 51.

The side damping portion is a wall portion is opposed toward the peripheral core surface 52g and extends upright from the bottom damping portion 81 toward the base member 32, that is, toward the housing 11. In detail, the side damping portion includes a first side portion 82a, opposing the portion of the peripheral core surface 52g intersecting the winding axis direction of the windings 53a and 53b, and a second side portion 82b, opposing the portion of the peripheral core surface 52g parallel to the winding axis direction of the windings 53a and 53b. A distal end of the side damping portion 82 projects beyond the windings 53a and 53b toward the base member 32. The side damping portion 82 intersects a plane including the winding axes of the two windings 53a and 53b.

In the present embodiment, the damping unit 80 covers the two the portion configuring the exposed portion 52d of the peripheral core surface 52g and the portion arranged on the peripheral core surface 52g of the windings 53a and 53b. Taking into consideration that the side surface of the common mode choke coil 51 is configured by the peripheral core surface 52g and the portion arranged on the peripheral core surface 52g of the windings 53a and 53b, the damping unit 80 can be said as covering the side surface of the common mode choke coil 51.

The opening 80a of the damping unit 80 is covered by the base member 32 of the inverter case 31. Further, the damping unit 80 and the base member 32 define an accommodation compartment 83 in the opening 80a. The common mode choke coil 51 is accommodated in the accommodation compartment 83. The upper core surface 52f of the common mode choke coil 51 at the side opposite to the bottom core surface 52e faces the base member 32 and is covered by the base member 32.

In accordance with such a configuration, the magnetic path of the leakage magnetic flux generated from the common mode choke coil 51 intersects the damping unit 80. Thus, the leakage magnetic flux passes the damping unit 80. This generates eddy current at the damping unit 80, impedes the flow of the leakage magnetic flux, and reduces the magnetic flux. That is, the damping unit 80 has a magnetic resistance with respect to the leakage magnetic flux generated from the common mode choke coil 51.

The damping unit 80 and the common mode choke coil 51 are insulated. The damping unit 80 and the common mode choke coil 51 may have any configuration. For example, the damping unit 80 and the common mode choke coil 51 may be opposed to each other with a gap or an insulation layer located in between.

In the present embodiment, the distal end of the side damping portion is spaced apart from the base member 32. Instead, the distal end of the side damping portion may be in contact with the base member 32. In this case, the damping unit 80 and the base member 32 (inverter case 31) form a closed loop, and the eddy current can be generated in a preferred manner. Furthermore, an electrically conductive or insulative interposing member may be arranged between the distal end of the side damping portion 82 and the base member 32.

As shown in FIGS. 2 and 3, the bottom damping portion 81 includes through holes 81a through which the terminals 61 to 64 are inserted. The terminals 61, 62, 63, and 64 are inserted through the through holes 81a, and connected to the corresponding wires EL11, EL12, EL21, and EL22.

Although not illustrated in the drawings, an insulative material is arranged between each of the terminals 61 to 64 and the inner surface of the corresponding through holes 81a. Thus, each of the terminals 61 to 64 is electrically insulated from the damping unit 80.

As shown in FIG. 1, the common mode choke coil 51 is arranged farther from the power module 42 than the capacitors 71 to 73. Specifically, each of the capacitors 71 to 73 is arranged between the common mode choke coil 51 and the power module 42.

Furthermore, the common mode choke coil 51 and the capacitors 71 to 73 are thermally coupled to the wall 11c of the housing 11. Specifically, the common mode choke coil 51 and the capacitors 71 to 73 are proximate to the inverter case 31 (base member) that is in contact with the wall 11c of the housing 11. For example, a distance H1 between the upper core surface 52f and the base member 32 is set to be shorter than a distance H2 between the bottom core surface 52e and the circuit board 41. The heat generated at the common mode choke coil 51 and each of the capacitors 71 to 73 is transmitted to the base member 32 and the wall 11c, and absorbed by the refrigerant in the housing 11. As shown in FIG. 3, a terminal is also arranged in each of the capacitors 71 to 73, and the terminal is connected to the wire pattern 41b of the circuit board 41.

The electrical configuration of the on-board motor-driven compressor 10 will now be described with reference to FIGS. 5 and 6.

As described above, the noise reducing unit 50 is located the input side of the power module 42 (specifically, each switching element Qu1 to Qw2). Specifically, the common mode choke coil 51 of the noise reducing unit 50 is located between the connector wires EL11 and EL21 and the module wires EL12 and EL22.

The common mode choke coil 51 generates the leakage magnetic flux when the normal mode current flows. Thus, as shown in FIG. 5, the common mode choke coil 51 includes hypothetic normal mode coils L1 and L2 apart from the windings 53a and 53b. That is, the common mode choke coil 51 of the present embodiment includes the two windings 53a and 53b and the hypothetic normal mode coils L1 and L2 in an equivalent circuit. The hypothetic normal mode coils L1 and L2 and the windings 53a and 53b are connected in series to each other. Although not shown in the drawings, the damping unit 80 functions as an impedance that lowers the Q value of the low pass filter circuit 74.

In addition to the inverter device 30, a power control unit (PCU) 103, for example, is installed as an on-board device in the vehicle. The PCU 103 uses the DC power supplied from the DC power supply E to drive the travelling motor mounted on the vehicle. That is, in the present embodiment, the PCU 103 and the inverter device 30 are connected in parallel to the DC power supply E, and the DC power supply E is shared by the PCU 103 and the inverter device 30.

The PCU 103 includes, for example, a step-up converter 104 and a travelling inverter. The step-up converter 104 includes a step-up switching element and cyclically turns ON and OFF the step-up switching element to step up the DC power of the DC power supply E. The travelling inverter converts the DC power boosted by the step-up converter 104 to a drive power for driving the travelling motor.

In such a configuration, the noise generated from the switching of the step-up switching element flows to the inverter device 30 as the normal mode noise. In other words, the normal mode noise contains a noise component corresponding to the switching frequency of the step-up switching element. The switching frequency of the step-up switching element differs in accordance with the vehicle model. Thus, the frequency of the normal mode noise differs in accordance with the vehicle model. The noise component corresponding to the switching frequency of the step-up switching element includes a noise component and a harmonic component in the same frequency as the switching frequency.

The bypass capacitors 71 and 72 are connected in series to each other. The first bypass capacitor 71 and the second bypass capacitor 72 each have a first end and a second end opposite to the first end. Specifically, the noise reducing unit 50 includes a bypass line EL3 connecting the first end of the first bypass capacitor 71 and the first end of the second bypass capacitor 72. The bypass line EL3 is grounded to the body of the vehicle.

A series-connected body of the bypass capacitors 71 and 72 is connected in parallel to the common mode choke coil 51. Specifically, the second end of the first bypass capacitor 71 is connected to the first module wire EL12 connecting the first winding 53a (first output terminal 62) and the power module 42 (first module input terminal 42a). The second end of the second bypass capacitor 72 is connected to the second module wire EL22 connecting the second winding 53b (second output terminal 64) and the power module 42 (second module input terminal 42b).

The smoothing capacitor 73 is located at the output side of the common mode choke coil 51 and the input side of the power module 42. Specifically, the smoothing capacitor 73 is arranged between and connected in parallel to the series-connected body of the bypass capacitors 71 and 72 and the power module 42. The smoothing capacitor 73 includes a first end and a second end at an opposite side of the first end. Specifically, the first end of the smoothing capacitor 73 is connected to a portion in the first module wire EL12 from a connecting point P1 with the first bypass capacitor 71 to the power module 42, and the second end of the smoothing capacitor 73 is connected to a portion in the second module wire EL22 from a connecting point P2 with the second bypass capacitor 72 to the power module 42.

Figure 6:
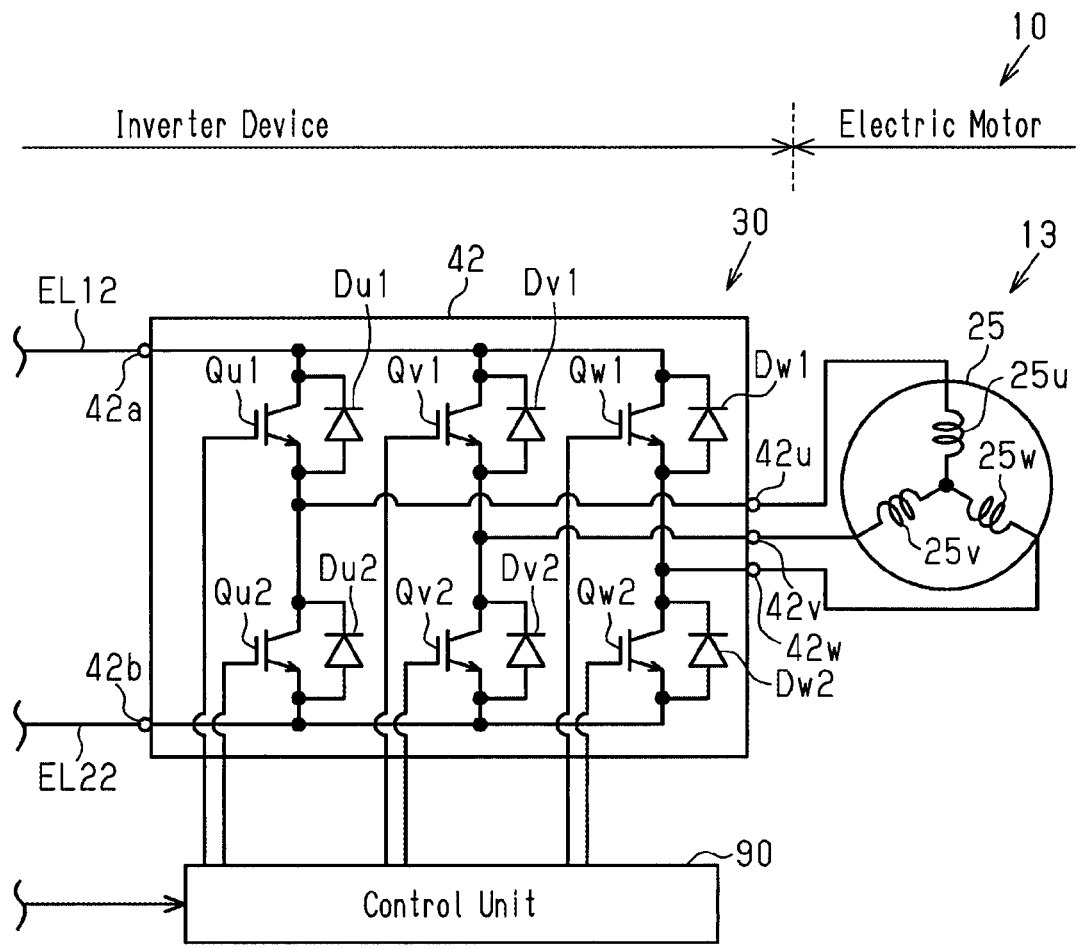
FIG. 6 is a circuit diagram showing the electrical configuration of the on-board motor-driven compressor of FIG. 1

As shown in FIG. 6, the coil 25 of the electric motor 13 has a three-phase structure, for example, a u phase coil 25u, v phase coil 25v, and a w phase coil 25w. The coils 25u to 25w, for example, are in a Y connection.

The power module 42 is an inverter circuit. The power module 42 includes u phase switching elements Qu1 and Qu2 corresponding to the u phase coil 25u, v phase switching elements Qv1 and Qv2 corresponding to the v phase coil 25v, and w phase switching elements Qw1 and Qw2 corresponding to the w phase coil 25w. Each of the switching elements Qu1 to Qw2 is, for example, a power switching element such as an IGBT. The switching element Qu1 to Qw2 includes a freewheeling diode (body diode) Du1 to Dw2.

The u phase switching elements Qu1 and Qu2 are connected in series via a connecting line, and the connecting line is connected to the u phase coil 25u via the u phase module output terminal 42u. The DC power from the DC power supply E is input to the series-connected body of the u phase switching elements Qu1 and Qu2. Specifically, the collector of the first u phase switching element Qu1 is connected to the first module input terminal 42a, and via the first module input terminal 42a, to the first module wire EL12. The emitter of the second u phase switching element Qu2 is connected to the second module input terminal 42b and via the second module input terminal 42b, to the second module wire EL22.

The other switching elements Qv1, Qv2, Qw1, and Qw2 are connected in the same manner as the u phase switching elements Qu1 and Qu2 although the corresponding coil is different. In this case, the switching elements Qu1 to Qw2 are connected to the two module wires EL12 and EL22.

A connecting line connecting the v phase switching elements Qv1 and Qv2 in series is connected to the v phase coil 25v via the v phase module output terminal 42v, and a connecting line connecting the w phase switching elements Qw1 and Qw2 in series is connected to the w phase coil 25w via the w phase module output terminal 42w. That is, the module output terminal 42u to 42w of the power module 42 are connected to the electric motor 13.

The inverter device 30 includes a control unit 90 that controls the power module 42 (specifically, switching operation of switching elements Qu1 to Qw2). The control unit 90, which is electrically connected to the air conditioning ECU 102 via the connector 43, and cyclically turns ON and OFF each of the switching elements Qu1 to Qw2 based on a command from the air conditioning ECU 102. Specifically, the control unit 90 executes pulse width modulation control (PWM control) on each of the switching elements Qu1 to Qw2 based on a command from the air conditioning ECU 102. More specifically, the control unit 90 generates a control signal using a carrier signal (carrier wave signal) and a command voltage value signal (comparison subject signal). The control unit 90 converts DC power to AC power by carrying out the ON/OFF control on each of the switching elements Qu1 to Qw2 using the generated control signal.

A cutoff frequency fc of the low pass filter circuit 74 is set to be lower than a carrier frequency f1, which is the frequency of the carrier signal. The carrier frequency f1 is also referred to as a switching frequency of each of the switching elements Qu1 to Qw2.

Figure 7:
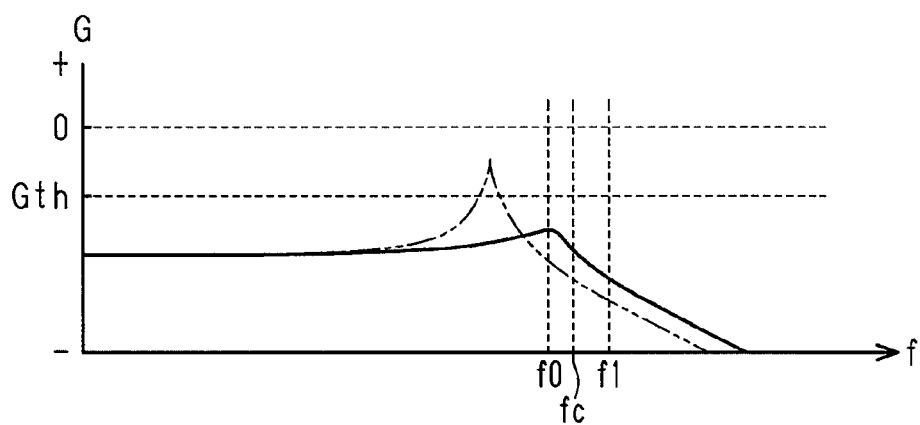
FIG. 7 is a graph showing the frequency characteristic of a low pass filter circuit with respect to normal mode noise.

The frequency characteristic of the low pass filter circuit 74 of the present embodiment will now be described with reference to FIG. 7. FIG. 7 is a graph showing the frequency characteristic of the low pass filter circuit 74 with respect to the normal mode noise flowing into the low pass filter circuit 74. The solid line of FIG. 7 indicates the frequency characteristic when the damping unit 80 is arranged, and the double-dashed line of FIG. 7 indicates the frequency characteristic when the damping unit 80 is not arranged.

As shown by the double-dashed line of FIG. 7, the Q value of the low pass filter circuit 74 is relatively high when the damping unit 80 is not arranged. Thus, the normal mode noise having a frequency close to the resonance frequency f0 of the low pass filter circuit 74 is less likely to be reduced in the noise reducing unit 50.

In the present embodiment, the Q value of the low pass filter circuit 74 is low, as shown by the solid line of FIG. 7, because of the damping unit 80. Thus, the noise reducing unit 50 reduces the normal mode noise having a frequency close to the resonance frequency f0 of the low pass filter circuit 74.

As shown in FIG. 7, the tolerable value of a gain (attenuation rate) required based on the specification of the vehicle is referred to as a tolerable gain Gth. The Q value at which the gain G of the low pass filter circuit 74 becomes the tolerable gain Gth when the frequency of the normal mode noise and the resonance frequency f0 is the same is referred to as a specific Q value. According to such a configuration, in the present embodiment, the Q value of the low pass filter circuit 74 is lower than the specific Q value because of the damping unit 80. Thus, the gain G of the low pass filter circuit 74 when the frequency of the normal mode noise is the same as the resonance frequency f0 is smaller than the tolerable gain Gth (greater in absolute value). In other words, the damping unit 80 is configured to have the Q value of the low pass filter circuit 74 that is lower than the specific Q value.

The leakage magnetic flux of the common mode choke coil 51 (i.e., inductance of hypothetic normal mode coils L1 and L2) is increased by the presence of the damping unit 80. Thus, the resonance frequency f0 of the low pass filter circuit 74 of the present embodiment is slightly higher compared to when the damping unit 80 is not included.

The present embodiment has the advantages described below.

(1) The on-board motor-driven compressor 10 includes the housing 11 having the suction port 11a, through which refrigerant (fluid) is drawn, the compression unit 12 and the electric motor 13 accommodated in the housing 11, and the inverter device 30 that drives the electric motor 13.

The inverter device 30 includes the power module 42, which converts DC power to AC power, and the noise reducing unit 50, which is located at the input side of the power module 42 to reduce the common mode noise and the normal mode noise contained in the DC power. The noise reducing unit 50 includes the common mode choke coil 51 including the core 52, the first winding 53a wound around the first core portion 52a of the core 52, and the second winding 53b wound around the second core portion 52b of the core 52. The inverter device 30 is configured so that the DC power of which the common mode noise and the normal mode noise are reduced by the common mode choke coil 51 is input to the power module 42. Specifically, the inverter device 30 includes the module wires EL12 and EL22 connecting the common mode choke coil 51 and the power module 42.

With such a configuration, the common mode choke coil 51 reduces the common mode noise contained in the DC power before the DC power is input to the inverter device 30. Furthermore, the common mode choke coil 51 generates the leakage magnetic flux when the normal mode current flows. Thus, the normal mode noise can be reduced using the low pass filter circuit 74 configured by the common mode choke coil 51 and the smoothing capacitor 73. Therefore, the DC power in which the two the common mode noise and the normal mode noise are reduced can be input to the power module 42 without arranging a coil dedicated to reducing the normal mode noise. This limits enlargement of the inverter device 30. Furthermore, enlargement of the on-board motor-driven compressor 10 is limited.

(2) The inverter device 30 includes the smoothing capacitor 73, which cooperates with the common mode choke coil 51 to configure the low pass filter circuit 74, and the damping unit 80, which is located at a position intersecting the magnetic path of the leakage magnetic flux generated from the common mode choke coil 51. The damping unit 80 generates eddy current with the leakage magnetic flux generated from the common mode choke coil 51 to lower the Q value of the low pass filter circuit 74. With such a configuration, the normal mode noise can be reduced by the low pass filter circuit 74 in a preferred manner. Furthermore, as the Q value of the low pass filter circuit 74 is lowered without a damping resistor or the like, versatility is increased while limiting enlargement of the on-board motor-driven compressor 10.

Specifically, as already described above, if the Q value of the low pass filter circuit 74 is high, the normal mode noise close to the resonance frequency f0 of the low pass filter circuit 74 is less likely to be reduced. Thus, the low pass filter circuit 74 having a high Q value may not effectively function on the normal mode noise having a frequency close to the resonance frequency f0. This may result in an erroneous operation of the inverter device 30 or shorten the life of the low pass filter circuit 74. Further, the low pass filter circuit 74 having a high Q value will not be applicable to a vehicle model that generates the normal mode noise having a frequency close to the resonance frequency f0. In this regard, in the present embodiment, the Q value is lowered by the damping unit 80. Thus, the normal mode noise having a frequency close to the resonance frequency f0 is easily reduced by the noise reducing unit 50 (specifically, low pass filter circuit 74). This widens the frequency band of the normal mode noise that can be reduced by the noise reducing unit 50. Furthermore, the on-board motor-driven compressor 10 is applicable to a wide variety of vehicle models.

To lower the Q value, for example, a damping resistor may be connected in series to the common mode choke coil 51. However, the damping resistor needs to correspond to a relatively high current of greater than or equal to 10 A and thus easily becomes relatively large. Further, power loss and the amount of heat generation also become large. Thus, a damping resistor is necessary to dissipate heat. This may enlarge the on-board motor-driven compressor 10. In the present embodiment, the eddy current is generated by the leakage magnetic flux in the damping unit 80, but the amount of heat generation of the damping unit 80 is small because the eddy current is lower than the current flowing to the damping resistor. Further, the damping unit 80 need only be located at a position intersecting the magnetic path of leakage magnetic flux generated from the common mode choke coil 51. Thus, the damping unit 80 has a high degree of freedom of location and may be arranged in a relatively small space. Accordingly, the versatility is increased while limiting enlargement of the on-board motor-driven compressor 10 and reduction the two types of noise.

(3) The damping unit 80 covers the side surface of the common mode choke coil 51, specifically, the peripheral core surface 52g and the portion arranged on the peripheral core surface 52g in the windings 53a and 53b. The peripheral core surface 52g is a plane intersecting the plane including the winding axes of the windings 53a and 53b. Thus, the damping unit 80 functions as a magnetic resistor with respect to the leakage magnetic flux. That is, the damping unit 80 functions as a magnetic resistor that lowers the Q value. Therefore, advantage (2) is realized with a relatively simple configuration.

(4) The inverter device 30 includes the inverter case 31, which accommodates the circuit board 41, the power module 42 and the noise reducing unit 50. The damping unit 80 is box-shaped and includes the opening 80a covered by the inverter case 31, and the common mode choke coil 51 is accommodated in the accommodation compartment 83 defined by the damping unit 80 and the inverter case 31. Thus, surfaces other than the upper core surface 52f corresponding to the opening 80a in the core 52 (specifically, peripheral core surface 52g and bottom core surface 52e) is covered by the damping unit 80, and hence the Q value of the low pass filter circuit 74 is lowered in a further preferred manner. Further, the inverter case 31 is configured by a thermally conductive non-magnetic body of an electrically conductive material. Thus, the inverter case 31 covering the opening 80a functions to lower the Q value. This further lowers the Q value.

(5) In particular, the common mode choke coil 51 is arranged proximate to the inverter case 31 so that the distance H1 between the upper core surface 52f and the base member 32 is shorter than the distance H2 between the bottom core surface 52e and the circuit board 41. This improves the damping effect of the inverter case 31 and further lowers the Q value.

(6) The power module 42 includes the plurality of switching elements Qu1 to Qw2 and converts DC power to AC power by executing PWM control on the plurality of switching elements Qu1 to Qw2. The cutoff frequency fc of the low pass filter circuit 74 is set to be lower than the carrier frequency f1, which is the frequency of the carrier signal used in the PWM control of each switching element Qu1 to Qw2. Thus, the ripple noise (normal mode noise generated in the power module 42) caused by the switching of each of the switching elements Qu1 to Qw2 is reduced (attenuated) by the low pass filter circuit 74, and the flow of ripple noise out of the on-board motor-driven compressor 10 is restricted. That is, the low pass filter circuit 74 functions to reduce the normal mode noise and the common mode noise flowing into the on-board compressor 10 when the PCU 103 operates. Further, the low pass filter circuit 74 functions to reduce the flow of the ripple noise out of the on-board motor-driven compressor 10 when the on-board motor-driven compressor 10 operates.

From the viewpoint of widening the frequency band of the normal mode noise that can be reduced by the noise reducing unit 50, the resonance frequency f0 may be set to be higher than the frequency band of the expected normal mode noise to avoid the generation of resonance. In this case, however, it becomes difficult to set the cutoff frequency fc to be lower than the carrier frequency f1 because the cutoff frequency fc of the low pass filter circuit 74 is also high. Further, an increase in the carrier frequency f1 when the cutoff frequency fc rises is not preferable because the switching loss of each of the switching elements Qu1 to Qw2 becomes large.

In contrast, in the present embodiment, the normal mode noise having a frequency close to the resonance frequency f0 can be reduced by the damping unit 80, and thus the resonance frequency f0 does not need to be high in accordance with the frequency band of the expected normal mode noise. Therefore, the cutoff frequency fc can be lower than the carrier frequency f1 without excessively raising the carrier frequency f1. Thus, the ripple noise caused by the switching of each switching element Qu1 to Qw2 can be restricted from flowing out of the on-board motor-driven compressor 10 while limiting increases in the power loss of the power module 42 or the like.

(7) The core 52 includes the first core portion 52a around which the first winding 53a is wound, the second core portion 52b around which the second winding 53b is wound, and the exposed portion 52d where the windings 53a and 53b are not wound and the surface 52c is exposed. Thus, the leakage magnetic flux is easily generated when the normal mode current flows to the wires EL1 and EL2 (specifically, windings 53a and 53b). This obtains advantage (1).

(8) The electric motor 13 of the on-board motor-driven compressor 10 generally requires a large AC power to be driven. Thus, a relatively large DC power needs to be converted to AC power for the inverter device 30 that drives the electric motor 13. The coil and the damping resistor for the normal mode noise that can be applied to such large DC power tend to become large. Therefore, the inverter device 30 tends to easily become large.

In contrast, in the present embodiment, the inverter device 30 including the noise reducing unit 50 described above is used to drive the electric motor 13 so that the on-board motor-driven compressor 10 can be operated while limiting the enlargement of the inverter device 30 and reducing noise.

(9) The inverter device 30 is integrated with the on-board motor-driven compressor 10. Specifically, the on-board motor-driven compressor 10 includes the housing 11, accommodating the compression unit 12 and the electric motor 13, and the inverter device 30, attached to the wall 11c arranged at the side of the electric motor 13 opposite the compression unit 12 in the housing 11. The compression unit 12, the electric motor 13, and the inverter device 30 are lined in the axial direction of the rotation shaft 21. Thus, increases in the size of the on-board motor-driven compressor 10 can be limited in the radial direction of the rotation shaft 21.

In this case, the installation space of the inverter device 30 is easily limited compared to the so-called camel back type on-board motor-driven compressor in which the inverter device 30 is arranged at the outer side of the housing 11 in the radial direction of the rotation shaft 21. With the present embodiment, the inverter device 30 is reduced in size, and the inverter device 30 can be installed in a relatively small space. Thus, the inverter device 30 can be relatively easily installed in the so-called in-line type on-board motor-driven compressor 10 in which the compression unit 12, the electric motor 13, and the inverter device 30 are lined in the axial direction of the rotation shaft 21.

The above embodiment described above may be modified as below.

Figure 8:
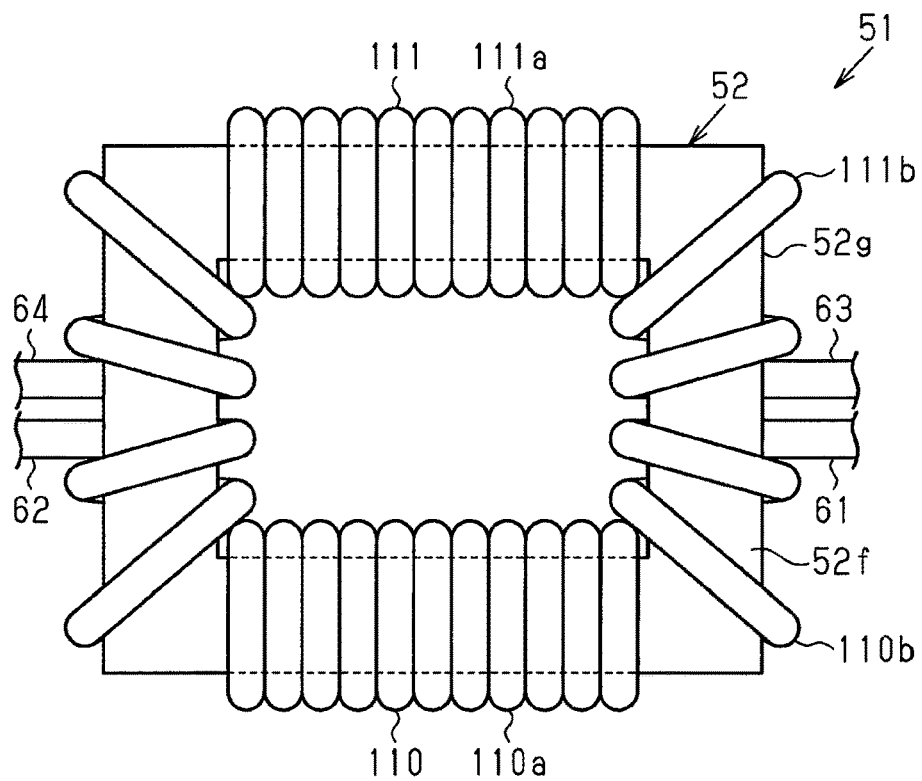
FIG. 8 is a front view schematically showing a common mode choke coil of another example.

As shown in FIG. 8, windings 110, 111 may be wound around the entire core 52. In this case, the winding 110, 111 may include high density portions 110a and 111a and low density portions 110b and 111b having relatively different winding densities. The winding density is the number of windings (number of turns) per unit length in the winding axis direction. In this case, the leakage magnetic flux is also easily generated from the common mode choke coil 51. Either one of the first winding 110 and the second winding 111 may have a configuration including the high density portion and the low density portion. In this case, the exposed portions and the low density portions both exist. In short, at least only one of the first winding 110 and the second winding 111 needs to include the high-density portion and the low-density portion.

The shape of the damping unit 80 is not limited to the embodiment described above. For example, the damping unit 80 may be a box-shaped and include an upper surface cover portion located between the upper core surface 52f and the base member 32 to cover the upper core surface 52f. Furthermore, the damping unit 80 does not need to be a completely closed box, and for example, a gap (slit) may be formed between the first side portion 82a and the second side portion 82b, or a through hole may be formed. Furthermore, at least one part of the damping unit 80 may be meshed. Further, at least one part of the damping unit 80 may include a recess, an embossment, a punching hole, or the like, Furthermore, the damping unit 80 may be frame-shaped, and the bottom damping portion 81 may omitted.

Furthermore, the side damping portion covers the entire peripheral core surface 52g but instead may cover part of the peripheral core surface 52g. For example, either one of the first side portion 82a or the second side portion 82b may be omitted. Furthermore, the damping unit 80 may have a configuration for covering only the portion configuring the exposed portion 52d in the peripheral core surface 52g and not covering the portion arranged on the peripheral core surface 52g in the windings 53a and 53b of the side surface of the common mode choke coil 51 or vice-versa. Furthermore, the damping unit 80 may have a configuration for covering part of or all of the exposed portion 52d on the peripheral core surface 52g or may have a configuration covering part of or all of the portion arranged on the peripheral core surface 52g in the windings 53a and 53b. In other words, the damping unit 80 only needs to cover at least one part of the side surface of the common mode choke coil 51. Moreover, the damping unit may be arranged on the inner side of the core 52. In other words, the damping unit 80 is preferably located at a position intersecting the leakage magnetic flux generated from the common mode choke coil 51 and opposing at least part of the common mode choke coil 51.

The material of the damping unit 80 need only be a non-magnetic metal and is not limited to aluminum. For example, the material may be copper.

The through hole into which each of the terminals 61 to 64 is inserted is formed in the side damping portion, and each terminal 61 to 64 may be configured to extend toward the side. In this case, the side damping portion also covers the entire peripheral core surface 52g.

Figure 9:
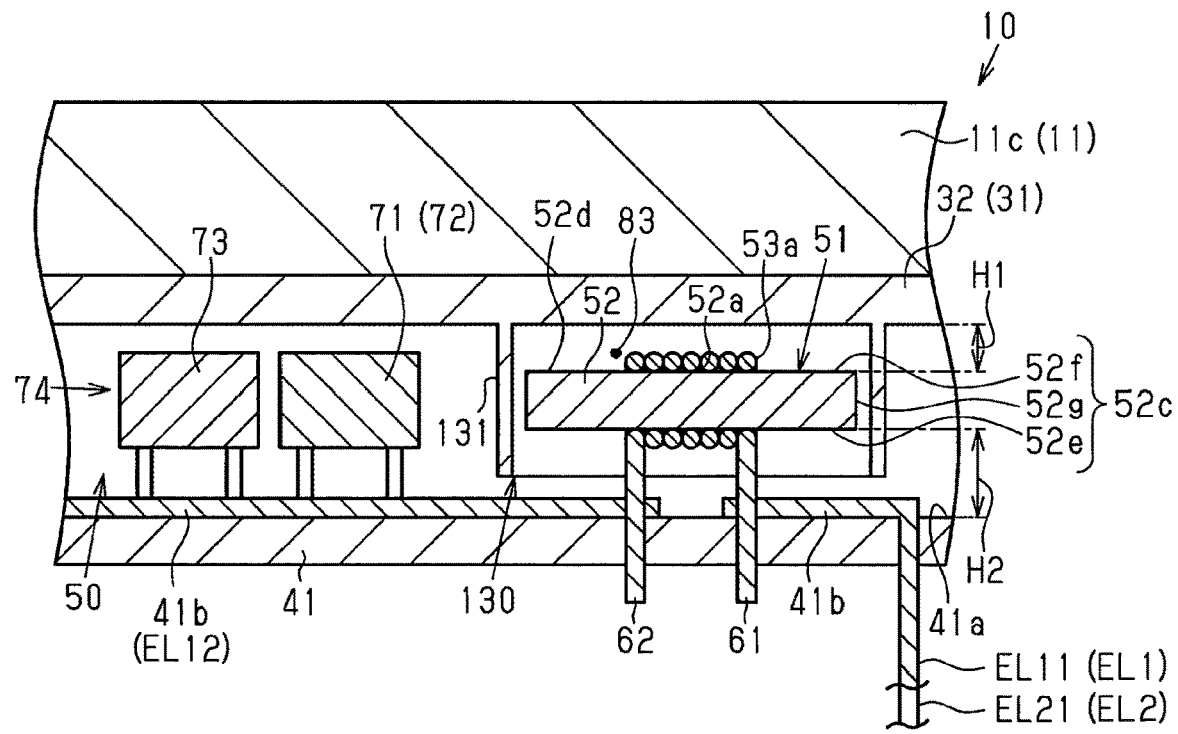
FIG. 9 is a cross-sectional view schematically showing a damping unit of another example.

Furthermore, as shown in FIG. 9, a damping unit 130 may have a configuration including a damping side portion 131 that extends upright from the base member 32 and surrounds the peripheral core surface 52g. That is, the damping unit may be separate from the inverter case 31 or be integrated with the inverter case 31.

The common mode choke coil 51 and the damping unit 80 may be set anywhere as long as they are in the inverter case 31. For example, as shown in FIG. 10, the common mode choke coil 51 and the damping unit 80 may be arranged not between the board surface 41a of the circuit board 41 and the base member 32 but so as to extend out of the circuit board 41 to the side of the circuit board 41.

Figure 10:
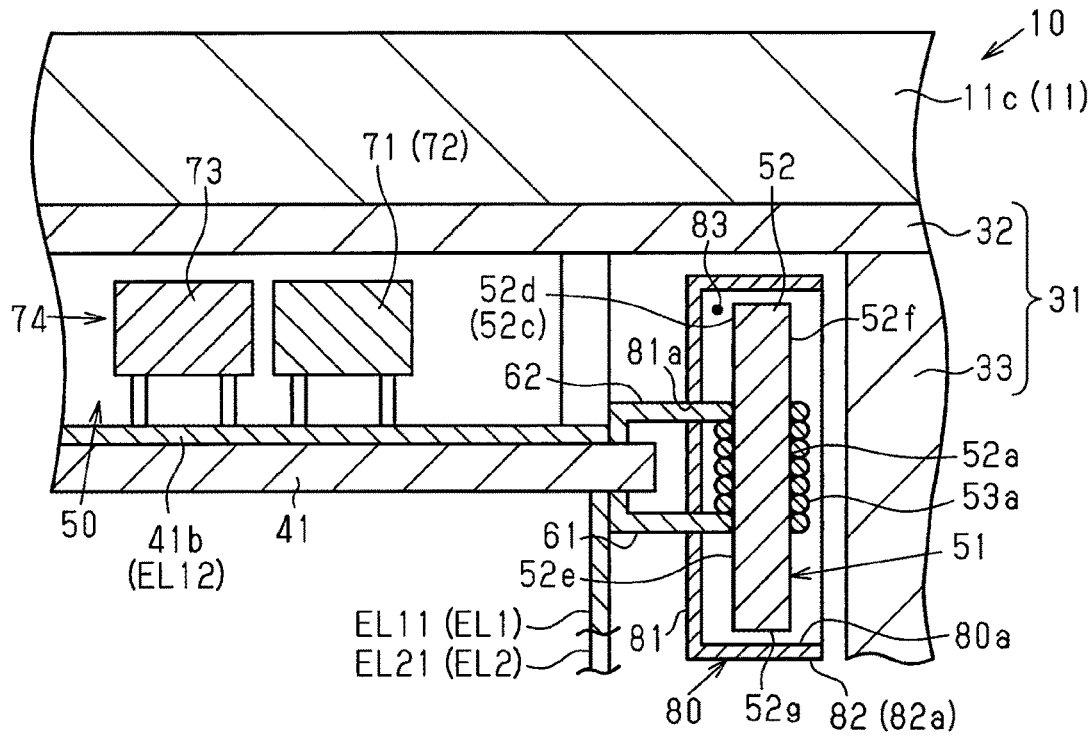
FIG. 10 is a cross-sectional view schematically showing a damping unit of another example.

Furthermore, as shown in FIG. 10, the common mode choke coil 51 may be arranged in a state the opposing direction of the board surface 41a and the base member 32 (i.e., thickness-wise direction of circuit board 41) intersects (extends orthogonal to) the thickness-wise direction of the core 52. In this case, the damping unit 80 only needs to be arranged such that the opening 80a is covered by the cover member 33.

The common mode choke coil 51 may be located between the board surface 41a and the base member 32 while extending upright so that the winding axis direction of the windings 53a and 53b coincides with the opposing direction of the board surface 41a and the base member 32.

The step-up converter 104 may be omitted. In this case, for example, noise caused by the switching frequency of the switching element of the travelling inverter is the normal mode noise.

An accommodation case (e.g., resin case) of an insulative non-magnetic body that accommodates the common mode choke coil 51 may be separately arranged. In this case, the damping unit is preferably a film (e.g., aluminum film) that is configured by an electrically conductive material of a non-magnetic body to cover the common mode choke coil 51 together with the entire accommodation case.

The inverter case 31 and the damping unit 80 may be formed from different materials.

The base member 32 may be omitted. In this case, the windings 53a and 53b and the distal end of the side damping portion, and the wall 11c of the housing 11 are preferably proximate or brought into contact via a gap or an insulation layer.

For example, in a configuration in which an annular rib extending upright from the wall 11c of the housing 11 is arranged, a plate-shaped inverter cover member may be attached while abutting against the rib in place of the inverter case. In this case, an accommodation chamber accommodating various types of components such as the circuit board 41, the power module 42, the noise reducing unit 50, and the like is preferably formed by the wall 11c of the housing 11, the rib, and the inverter cover member. In short, the specific configuration partitioning the accommodation chamber is arbitrary.

The core 52 may have any shape. For example, a UU core, an EE core, a toroidal core, or the like may be used as the core. Furthermore, the core does not need to have a completely closed ring shape and may have a configuration including a gap. The peripheral core surface 52g may be a curved surface.

The on-board motor-driven compressor 10 of the embodiment described above is a so-called in-line type but instead, for example, may be a so-called camel back type in which the inverter device 30 is arranged on the radially outer side of the rotation shaft 21 with respect to the housing 11. In short, the inverter device 30 may be arranged at any location.

The module wires EL12 and EL22 may both be omitted. The output terminals 62 and 64 of the common mode choke coil 51 and the module input terminals 42a and 42b of the power module 42 may be directly connected. Furthermore, the smoothing capacitor 73 and the like may be directly connected to the output terminals 62, 64.

The on-board motor-driven compressor 10 is used in the on-board air conditioner 100. Instead, for example, when a fuel battery is mounted on the vehicle, the on-board motor-driven compressor 10 may be used in an air supplying device that supplies air to a fuel battery. That is, the fluid to be compressed is not limited to the refrigerant, and may be any fluid such as air.

The on-board device is not limited to the PCU 103 and may be any device as long as a switching element is cyclically turned ON and OFF. For example, the on-board device may be an inverter or the like that is separate from the inverter device 30.

The circuit configuration of the noise reducing unit 50 is not limited to that of the embodiment described above. For example, the smoothing capacitor 73 may be omitted or two smoothing capacitors 73 may be arranged. Furthermore, the positions of the bypass capacitors 71 and 72 and the smoothing capacitor 73 may be replaced, or the bypass capacitors 71 and 72 may be arranged at a pre-stage of the common mode choke coil 51 (between common mode choke coil 51 and connector 43). The low pass filter circuit may be of any type such as a Π type, a T type, and the like.

Each example described above may be combined, or each example and the embodiment may be appropriately combined.

Second Embodiment

A second embodiment will now be described focusing on differences from the first embodiment and the example.

Figure 11:
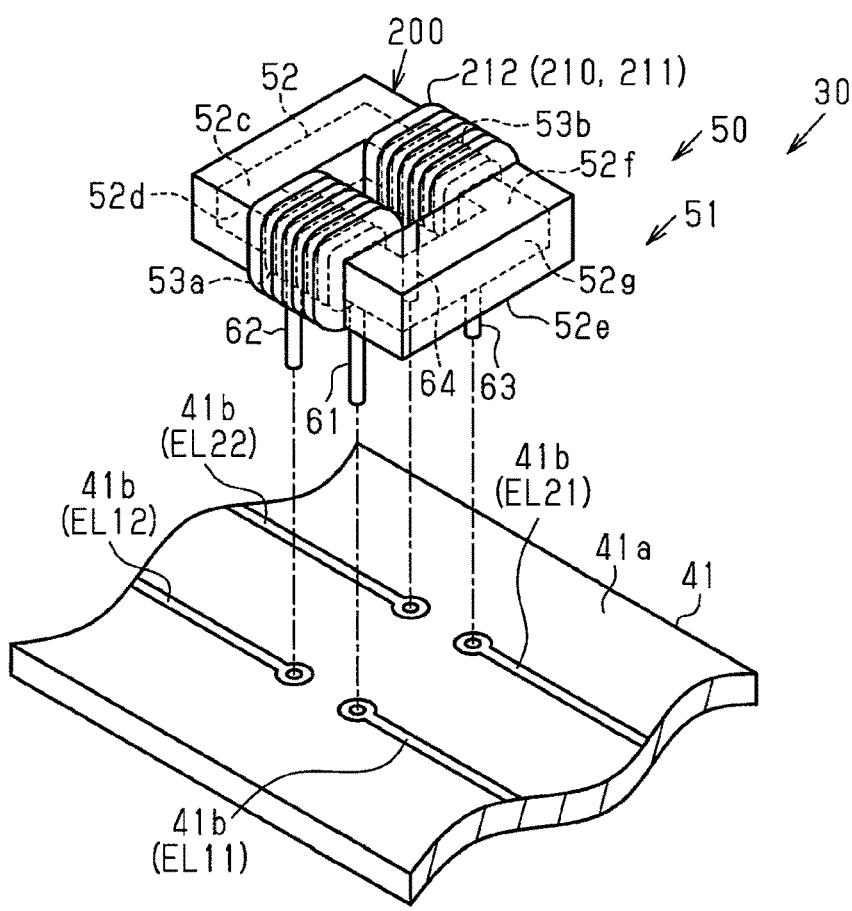
FIG. 11 is an exploded perspective view schematically showing a noise reducing unit according to a second embodiment.
Figure 12:
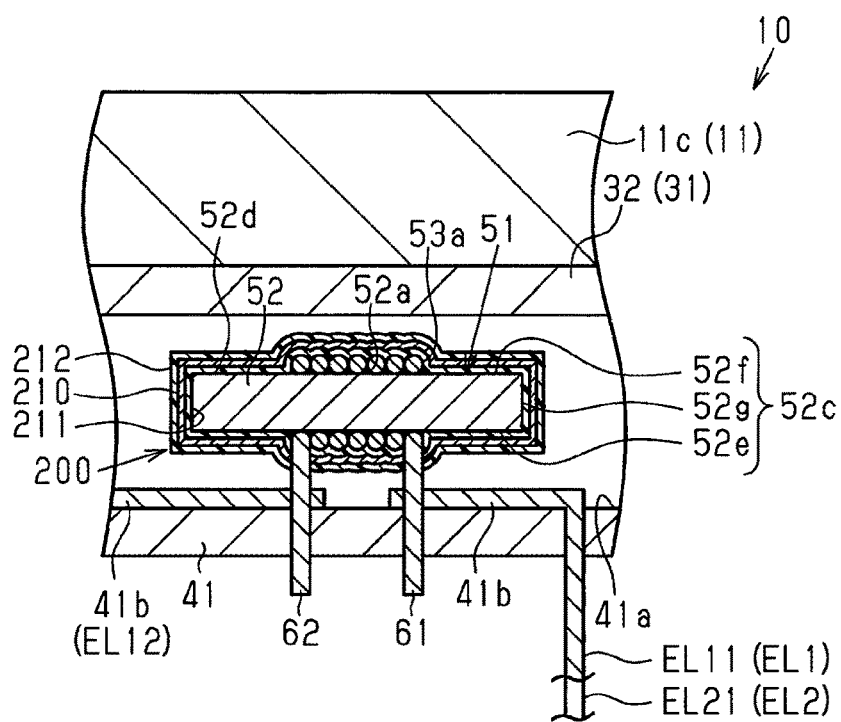
FIG. 12 is a cross-sectional view schematically showing the noise reducing unit of FIG. 11.
Figure 13:
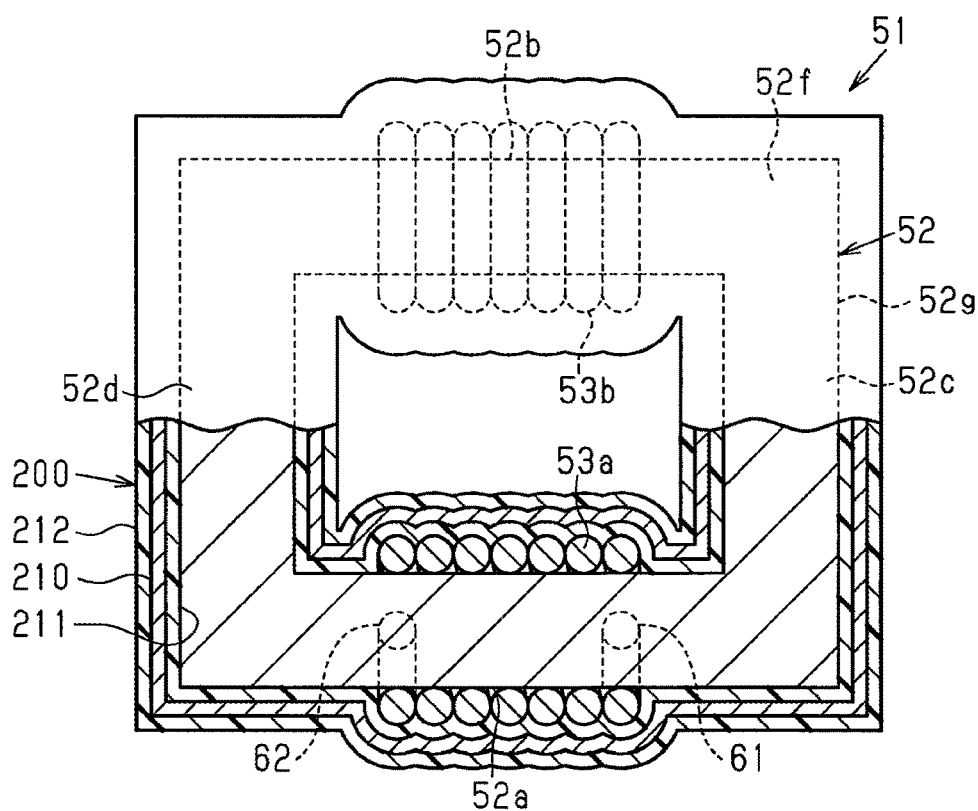
FIG. 13 is a partially cutaway view of a common mode choke coil and a damping unit in the noise reducing unit of FIG. 11.

FIGS. 11, 12, and 13 show a noise reducing unit (damping unit 200) according to a second embodiment.

In the first embodiment, the damping unit 80 shown in FIGS. 2 and 3 is box-shaped and includes the opening 80a covered by the inverter case 31 and the bottom portion (end wall), and the common mode choke coil 51 is accommodated in the accommodation compartment 83 defined by the damping unit 80 and the inverter case 31 to lower the Q value of the low pass filter circuit 74. However, when mounting the common mode choke coil 51 on the circuit board 41, it may be difficult to cover the six surfaces of the common mode choke coil 51 with metal.

In the second embodiment, plating is performed on the common mode choke coil 51 so that the common mode choke coil 51 is covered with a shield electrically conductive metal film 210, and the damping unit 200 includes a shield electrically conductive metal film 210 covering at least part of the common mode choke coil 51. When plating the common mode choke coil 51, an insulating film 211 for coating is located between the shield electrically conductive metal film 210 and the common mode choke coil 51 to ensure insulation and join the shield electrically conductive metal film 210 and the common mode choke coil 51. Thus, effects similar to that when covering the six surfaces with metal is obtained with the common mode choke coil 51.

This will be specifically described below.

The common mode choke coil 51 has a surface with at least one part covered with the shield electrically conductive metal film 210. The shield electrically conductive metal film 210 includes a plated film of copper, and the shield electrically conductive metal film 210 is configured by an electrically conductive material of a non-magnetic body. The insulating film 211 is interposed between the shield electrically conductive metal film 210 and the common mode choke coil 51. That is, although it is difficult to directly perform plating on the core 52, the insulating film 211 made of resin and the like serving as a coating material is formed on the surface of the core 52, and the plating is performed on such surface to form the shield electrically conductive metal film 210. The surface of the shield electrically conductive metal film 210 is covered with the insulating film 212. Specifically, the windings 53a and 53b are electrically conductive wires covered with the insulating film, but may be further covered with the insulating film 211, 212 so as to have excellent insulating property. In other words, the windings 53a and 53b realize enhanced quality by having a multiple-insulating structure. Thus, the common mode choke coil 51 is covered with three layers of films, the insulating film 211, the shield electrically conductive metal film 210, and the insulating film 212 by winding the windings 53a and 53b around the core 52, forming the shield electrically conductive metal film 210 via the insulating film 211 with respect to the core 52 wound with the windings 53a and 53b, and covering the shield electrically conductive metal film 210 with the insulating film 212.

The damping unit 80 in the first embodiment includes the through holes 81a into which each terminal 61 to 64 is inserted at the bottom damping portion 81, as shown in FIGS. 2 and 3, and has a configuration in which the terminals 61 to 64 are extended through the through holes 81a. This requires a means for to be insulative. In the second embodiment, in contrast, a through hole for inserting the terminal may be unnecessary.

The entire common mode choke coil 51 may be covered with the shield electrically conductive metal film 210 or part may be partially covered with the shield electrically conductive metal film 210. By covering at least part of the common mode choke coil 51, eddy current can be generated with leakage magnetic flux. Furthermore, the shield electrically conductive metal film 210 is not limited to a plated film, and for example, may be a metal film formed by being applied. In addition, the material of the shield electrically conductive metal film 210 need only be a non-magnetic metal and is not limited to copper. Moreover, one of the insulating film 211 or the insulating film 212 may be omitted.

Third Embodiment

A third embodiment will now be described focusing on differences from the first embodiment and the examples.

Figure 14:
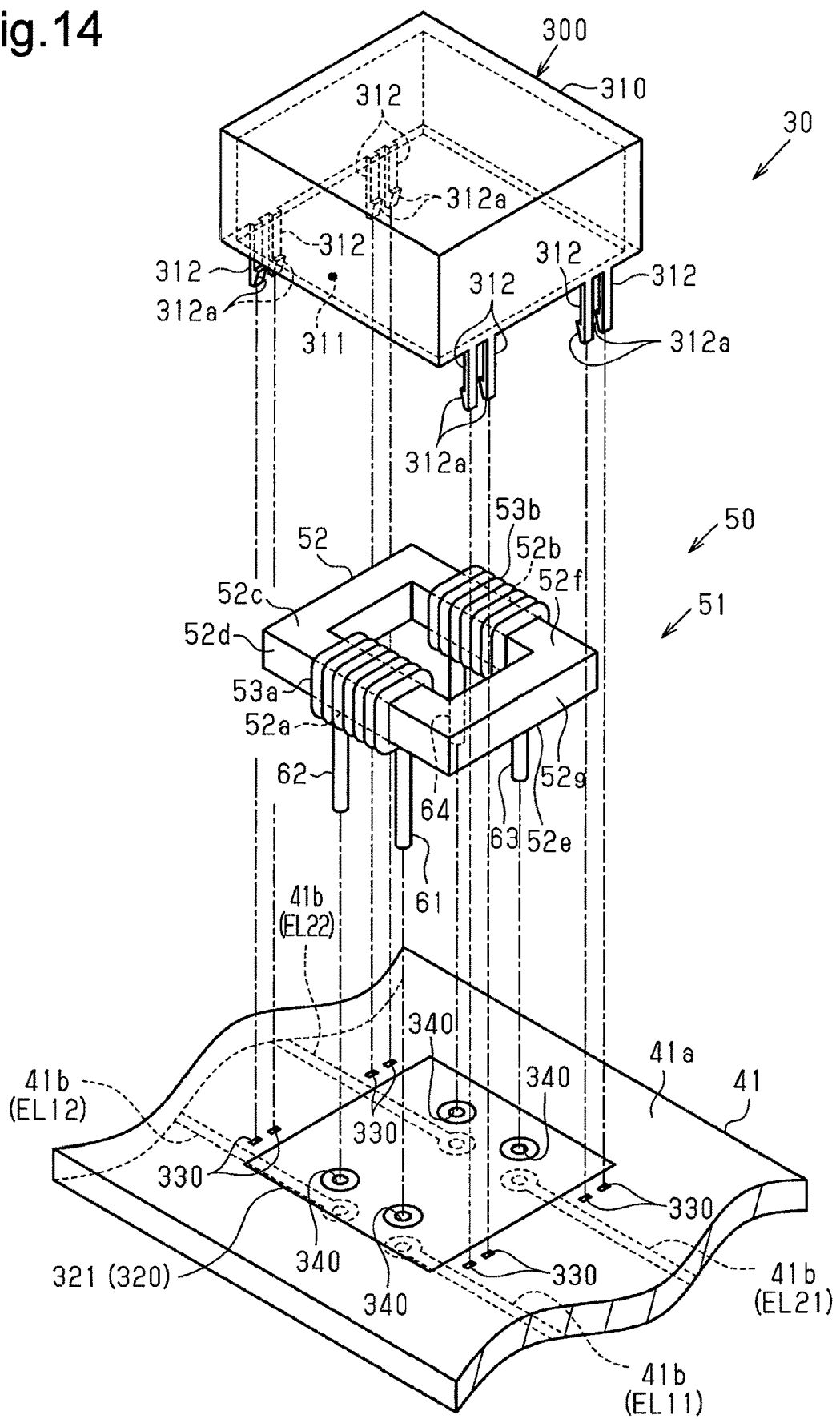
FIG. 14 is an exploded perspective view schematically showing a noise reducing unit according to a third embodiment.
Figure 15:
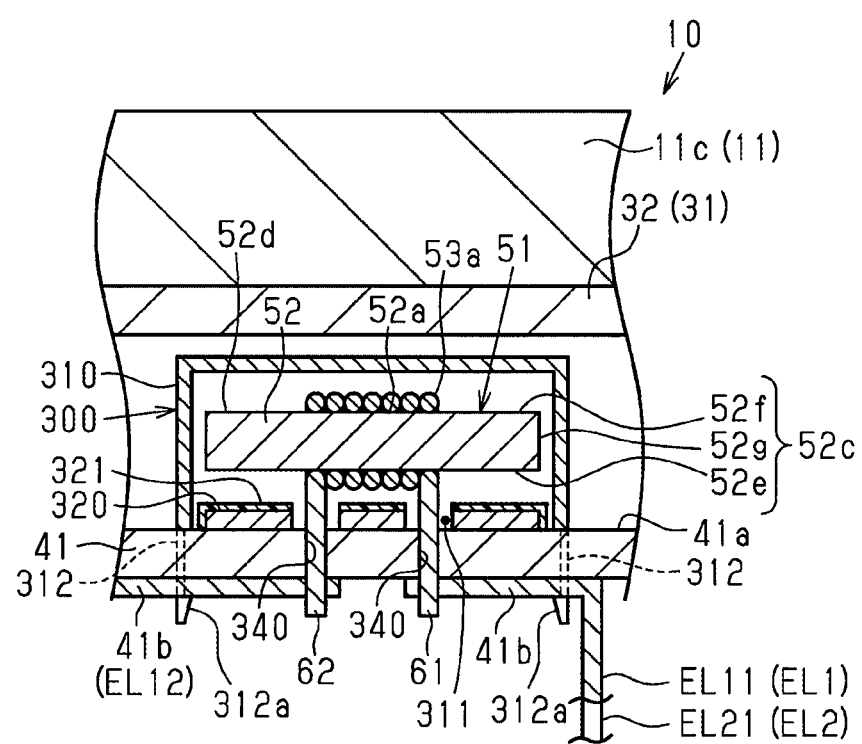
FIG. 15 is a cross-sectional view schematically showing the noise reducing unit of FIG. 14.

FIGS. 14 and 15 show a noise reducing unit (damping unit 300) according to a third embodiment.

In the first embodiment, the common mode choke coil 51 is accommodated in the accommodation compartment 83 defined by the box-shaped damping unit 80 including the opening 80a and the bottom portion (end wall) and the inverter case 31 to lower the Q value of the low pass filter circuit 74, as shown in FIGS. 2 and 3. However, when mounting the common mode choke coil 51 on the circuit board 41, it may be difficult to cover the six surfaces of the common mode choke coil 51 with metal.

In the third embodiment, in the common mode choke coil 51, one of the six surfaces is covered with a pattern conductor (copper foil) 320 of the circuit board 41, and the other five surfaces are covered with a shield electrically conductive metal case 310 including an opening 311. That is, the inverter device 30 includes the circuit board 41 having a wire pattern. The damping unit 300 includes the shield electrically conductive metal case 310 and the shield pattern conductor 320. The shield electrically conductive metal case 310 accommodates the common mode choke coil 51 from the opening 311 and is fixed to the circuit board 41 in such a state. The shield pattern conductor 320 is formed in a region at an inner side of the opening 311 of the shield electrically conductive metal case 310 in the circuit board 41. Thus, the same advantages as when covering the six surfaces of the common mode choke coil 51 with metal are obtained. Further, the pattern conductor 320 may use a pattern conductor that was originally provided on the circuit board 41. This allows for the elimination of part of the processing performed in order to add the damping unit 300.

This will be specifically described below.

The shield electrically conductive metal case 310 has a substantially cuboid and box-shaped. The shield electrically conductive metal case 310 is made of copper, and the shield electrically conductive metal case 310 is configured by an electrically conductive material of a non-magnetic body (e.g., ferromagnetic body). The shield electrically conductive metal case 310 accommodates the common mode choke coil 51 from the opening 311, and is fixed to the circuit board 41 so as to close the opening 311 with the circuit board 41. An attachment leg portion 312 linearly extending toward the circuit board 41 is provided over a plurality of locations at a peripheral edge of the opening 311.

The shield pattern conductor 320 is formed in a region corresponding to the opening 311 in the circuit board 41. The shield pattern conductor 320 has the surface covered with the insulating film 321. The insulating film 321 is a resist film. The pattern wire 41b and the shield pattern conductor 320 are made of copper foil, and the pattern wire 41b and the shield pattern conductor 320 is configured by an electrically conductive material of a non-magnetic body (e.g., ferromagnetic body). A through hole 330 is formed at a position corresponding to each attachment leg portion 312 of the shield electrically conductive metal case 310 in the circuit board 41. The shield electrically conductive metal case 310 is attached to the circuit board 41 by inserting each attachment leg portion 312 of the shield electrically conductive metal case 310 into the through hole 330 of the circuit board 41. The attachment leg portion 312 is prevented from falling out by a stopper 312a (hook) at a distal end in a state in which the attachment leg portion 312 is extended through the through hole 330.

Furthermore, a through hole 340 is formed at a position corresponding to the terminal 61 to 64 of the common mode choke coil 51 in the circuit board 41. The terminal 61 to 64 of the common mode choke coil 51 is inserted into the through hole 340 of the circuit board 41. A distal end projecting out from the circuit board 41 in the terminal 61 to 64 is soldered with the wire pattern 41b.

The damping unit 80 in the first embodiment includes the through holes 81a, into which the terminals 61 to 64 can be inserted, at the bottom damping portion 81, as shown in FIGS. 2 and 3. In the third embodiment, the terminal 61 to 64 extends through the opening 311 of the shield electrically conductive metal case 310 so that the through hole for inserting the terminal becomes unnecessary in the shield electrically conductive metal case 310.

The shield pattern conductor 320 is not limited to a copper foil, and for example, may be configured using a copper plated film. Furthermore, the damping unit 300 provided on the circuit board 41 only needs to be a shield electrically conductive metal film and is not limited to pattern conductor 320. For example, a copper foil may be applied to the circuit board 41 as the shield electrically conductive metal film. Additionally, an insulating film may be located between the copper foil and the circuit board 41.

Further, the material of the damping unit 300 provided on the circuit board 41 only needs to be a non-magnetic metal and is not limited to copper. For example, the material may be aluminum.

DESCRIPTION OF REFERENCE CHARACTERS 10) on-board motor-driven compressor; 11) housing; 12) compression unit; 13) electric motor; 30) inverter device; 31) inverter case; 41) circuit board; 41b) wire pattern; 42) power module (inverter circuit); 50) noise reducing unit; 51) common mode choke coil; 52) core; 52a) first core portion; 52b) second core portion; 52c) core surface; 52d) exposed portion; 52g) peripheral core surface; 53a, 110) first winding; 53b, 111) second winding; 71, 72) bypass capacitor; 73) smoothing capacitor; 74) low pass filter circuit; 80, 130) damping unit; 80a) opening; 83) accommodation compartment; 100) on-board air conditioner; 103) PCU; 110a, 111a) high density portion; 110b, 111b) low density portion; 200) damping unit; 210) shield electrically conductive metal film; 300) damping unit; 310) shield electrically conductive metal case; 320) shield pattern conductor (shield electrically conductive metal film); f0) resonance frequency of low pass filter circuit; f1) carrier frequency; fc) cutoff frequency; Qu1 to Qw2) switching element of power module

The invention claimed is:

1. An on-board motor-driven compressor comprising:
a housing including a suction port through which fluid is drawn in;
a compression unit accommodated in the housing and configured to compress the fluid;
an electric motor accommodated in the housing and configured to drive the compression unit; and
an inverter device configured to drive the electric motor, wherein the inverter device includes
an inverter circuit configured to convert DC power to AC power, and
a noise reducing unit arranged at an input side of the inverter circuit and configured to reduce common mode noise and normal mode noise contained in the DC power before the DC power is input to the inverter circuit, wherein the noise reducing unit includes
a common mode choke coil including a core having a first core portion and a second core portion, a first winding wound around the first core portion, and a second winding wound around the second core portion, and
a smoothing capacitor that cooperates with the common mode choke coil to configure a low pass filter circuit, and
the inverter device further includes a damping unit located at a position intersecting a magnetic path of a leakage magnetic flux generated from the common mode choke coil, wherein the damping unit generates eddy current with the leakage magnetic flux to lower a Q value of the low pass filter circuit.

2. The on-board motor-driven compressor according to claim 1, wherein the damping unit covers at least one part of a side surface of the common mode choke coil.

3. The on-board motor-driven compressor according to claim 1, wherein
the inverter device includes
a circuit board including a wire pattern, and
an inverter case accommodating the inverter circuit, the circuit board, and the noise reducing unit; and
the damping unit is box-shaped and includes an opening covered by the inverter case; and
the common mode choke coil is accommodated in an accommodation compartment defined by the damping unit and the inverter case.

4. The on-board motor-driven compressor according to claim 1, wherein the damping unit includes a shield electrically conductive metal film that covers at least one part of the common mode choke coil.

5. The on-board motor-driven compressor according to claim 1, wherein the damping unit is made of an electrically conductive material of a non-magnetic body.

6. The on-board motor-driven compressor according to claim 1, wherein
the low pass filter circuit has a specific Q value when a gain of the low pass filter circuit with respect to the normal mode noise having a frequency that is the same as a resonance frequency of the low pass filter circuit is a tolerable gain set based on a specification of a vehicle; and
the damping unit is configured to lower a Q value of the low pass filter circuit from the specific Q value.

7. The on-board motor-driven compressor according to claim 1, wherein the damping unit covers the common mode choke coil to form a closed loop.

8. The on-board motor-driven compressor according to claim 1, wherein
the first winding and the second winding are opposed to each other and have winding axes extending in a same direction, and
the damping unit covers the first and second windings in a direction orthogonal to a winding axis direction of the first and second windings.

9. The on-board motor-driven compressor according to claim 1, wherein the core includes:
an exposed portion where the first and second windings are not wound and a surface of the core is exposed, and
a peripheral core surface, the peripheral core surface being a first plane intersecting a second plane including winding axes of the first and second windings, and wherein the damping unit covers a portion of the peripheral core surface where the first and second windings are wound, without covering a portion including the exposed portion of the peripheral core surface.

10. The on-board motor-driven compressor according to claim 1, wherein
the inverter device includes a circuit board including a wire pattern; and
the damping unit includes
a shield electrically conductive metal case including an opening, wherein the common mode choke coil is accommodated in the shield electrically conductive metal case through the opening, and the shield electrically conductive metal case is fixed to the circuit board so as to close the opening with the circuit board, and
a shield electrically conductive metal film formed in a region at an inner side of the opening on the circuit board.

11. The on-board motor-driven compressor according to claim 10, wherein the shield electrically conductive metal film is a shield pattern conductor.

* * * * *